US012777603B2

(12) United States Patent
Park et al.

(10) Patent No.: US 12,777,603 B2
(45) Date of Patent: Oct. 27, 2026

(54) ELECTRONIC DEVICE INCLUDING ANTENNA STRUCTURE USING HOUSING

(71) Applicant: Samsung Electronics Co., Ltd., Suwon-si (KR)

(72) Inventors: Sungkoo Park, Suwon-si (KR); Mincheol Seo, Suwon-si (KR); Soonho Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 74 days.

(21) Appl. No.: 18/893,601

(22) Filed: Sep. 23, 2024

(65) Prior Publication Data

US 2025/0016947 A1 Jan. 9, 2025

Related U.S. Application Data

(63) Continuation of application No. PCT/KR2023/003871, filed on Mar. 23, 2023.

(30) Foreign Application Priority Data

Mar. 24, 2022 (KR) ........................ 10-2022-0036953
May 2, 2022 (KR) ........................ 10-2022-0054482

(51) Int. Cl.
*H05K 7/14* (2006.01)
*H04M 1/02* (2006.01)
(Continued)

(52) U.S. Cl.
CPC ........ *H05K 7/1427* (2013.01); *H04M 1/0235* (2013.01); *H04M 1/0268* (2013.01);
(Continued)

(58) Field of Classification Search
CPC ....... H01Q 1/243; H01Q 9/42; H04M 1/0235; H04M 1/0237; H04M 1/0268; H04M 1/0277
See application file for complete search history.

(56) References Cited

U.S. PATENT DOCUMENTS 10,283,865 B2 5/2019 Roh et al.
11,228,093 B2 1/2022 Won et al.
(Continued)

FOREIGN PATENT DOCUMENTS

CN 108682936 10/2018
DE 202019005676 6/2021
(Continued)

OTHER PUBLICATIONS

International Search Report for PCT/KR2023/003871 mailed Jul. 7, 2023, 4 pages.
(Continued)

*Primary Examiner* — Robin J Mishler
(74) *Attorney, Agent, or Firm* — Nixon & Vanderhye P.C.

(57) ABSTRACT

An electronic device according to an embodiment comprises: an inner housing; an outer housing coupled to the inner housing such that the inner housing is configured to move along a first direction or a second direction opposite to the first direction, and includes an opening formed in a portion of a surface that faces the second direction and connected to a space formed by the coupling of the outer housing and the inner housing; a side member comprising a conductive material and including at least one conductive portion which forms at least a portion of the side surface of the outer housing facing the second direction; and a wireless communication circuit operatively connected to the at least one conductive portion, wherein the wireless communication circuit can be configured to communicate with an
(Continued)

external electronic device in a designated frequency band through the at least one conductive portion.

20 Claims, 20 Drawing Sheets

(51) Int. Cl.
*H05K 1/02* (2006.01)
*H05K 1/14* (2006.01)

(52) U.S. Cl.
CPC ........ *H04M 1/0277* (2013.01); *H05K 1/0277* (2013.01); *H05K 1/14* (2013.01)

(56) References Cited

U.S. PATENT DOCUMENTS

| | | | | |
|---|---|---|---|---|
| 11,303,015 | B2 | 4/2022 | Edwards et al. | |
| 11,470,729 | B2 | 10/2022 | Kim et al. | |
| 11,561,576 | B2 | 1/2023 | Kang et al. | |
| 11,848,563 | B2 | 12/2023 | Kim et al. | |
| 2013/0194138 | A1* | 8/2013 | Hammond | H01Q 13/10 343/702 |
| 2020/0144699 | A1 | 5/2020 | Jeon et al. | |
| 2020/0196460 | A1 | 6/2020 | Myers | |
| 2021/0135492 | A1* | 5/2021 | Kim | H02J 7/02 |
| 2021/0359392 | A1 | 11/2021 | Won et al. | |
| 2022/0019260 | A1 | 1/2022 | Kang et al. | |
| 2022/0019261 | A1 | 1/2022 | Kang et al. | |
| 2022/0053653 | A1 | 2/2022 | Jung et al. | |
| 2023/0055951 | A1 | 2/2023 | Jang et al. | |
| 2023/0085200 | A1 | 3/2023 | Oh et al. | |
| 2023/0092831 | A1 | 3/2023 | Kim et al. | |
| 2023/0144130 | A1 | 5/2023 | Kim et al. | |
| 2023/0208013 | A1 | 6/2023 | Lee et al. | |
| 2024/0097322 | A1* | 3/2024 | Kim | H01Q 3/12 |

FOREIGN PATENT DOCUMENTS

| | | | | |
|---|---|---|---|---|
| KR | 20100008922 | A | 1/2010 | |
| KR | 20190115888 | A | 10/2019 | |
| KR | 20200051399 | A | 5/2020 | |
| KR | 102117213 | B1 | 6/2020 | |
| KR | 10-2021-0116380 | | 9/2021 | |
| KR | 20210116380 | A | 9/2021 | |
| KR | 20210132971 | A | 11/2021 | |
| KR | 20210145381 | A | 12/2021 | |
| KR | 102364605 | B1 | 2/2022 | |
| KR | 20220014806 | A | 2/2022 | |
| KR | 20220021400 | A | 2/2022 | |
| KR | 10-2022-0030803 | | 3/2022 | |
| KR | 20220027600 | A | 3/2022 | |
| WO | WO-2019194520 | A1 * | 10/2019 | H05K 1/18 |

OTHER PUBLICATIONS

Written Opinion of the ISA for PCT/KR2023/003871 mailed Jul. 7, 2023, 3 pages.

Extended European Search Report dated May 21, 2025 issued in European Patent Application No. 23775328.0.

* cited by examiner

ELECTRONIC DEVICE INCLUDING ANTENNA STRUCTURE USING HOUSING

CROSS-REFERENCE TO RELATED APPLICATIONS

This application is a continuation of International Application No. PCT/KR2023/003871 designating the United States, filed on Mar. 23, 2023, in the Korean Intellectual Property Receiving Office and claiming priority to Korean Patent Application Nos. 10-2022-0036953, filed on Mar. 24, 2022, and 10-2022-0054482, filed on May 2, 2022, in the Korean Intellectual Property Office, the disclosures of each of which are incorporated by reference herein in their entireties.

BACKGROUND

Field

The disclosure relates to an electronic device including an antenna structure using a housing.

Description of Related Art

An electronic device may communicate with an external electronic device using an antenna for wireless communication. Electronic devices, such as e.g., a smartphone, a tablet computer, or a notebook computer may include a plurality of antennas for various schemes of wireless communication with external electronic devices. An electronic device may have a structure adapted to enhance its spatial efficiency for arranging a plurality of antennas.

In order to achieve better portability and usability of electronic devices, flexible electronic devices capable of providing a large-screen display as required are under development. Such a flexible electronic device may include a structure for enabling a change in a state of the electronic device. Including such a structure for providing a change in the state of the electronic device may result in a lack of mounting space for disposing antennas inside the electronic device.

SUMMARY

Various embodiments of the disclosure may provide a structure having an antenna structure using a portion of a housing of an electronic device.

According to an example embodiment, an electronic device may include: an inner housing; an outer housing coupled to the inner housing and configured to enable the inner housing to move in a first direction or a second direction opposite to the first direction, the outer housing including an opening connected to a space formed by the inner housing and the outer housing, formed at a portion of a surface facing the second direction; a side member including a conductive material including at least one conductive portion forming at least a portion of a side surface of the outer housing facing the second direction; and a wireless communication circuit operably coupled to the at least one conductive portion. According to an example embodiment, the wireless communication circuit may be configured to communicate with an external electronic device with a specified frequency band through at least one conductive portion According to an example embodiment, an electronic device may include: an inner housing; an outer housing coupled to the inner housing and configured to enable the inner housing to move in a first direction or a second direction opposite to the first direction, the outer housing including an opening connected to a space formed by the inner housing and the outer housing, formed at a portion of a surface facing the second direction; a display including a planar portion disposed on the inner housing and visible to an outside and a deformable portion extending from the planar portion toward the second direction, the display configured to expand as the inner housing moves in the first direction or to contract as the inner housing moves in the second direction; a side member comprising a conductive material including at least one conductive portion forming at least a portion of a side of the outer housing overlapping the opening and a portion of the deformable portion, when the outer housing is viewed in the second direction; a wireless communication circuit operably coupled with the at least one conductive portion; and a flexible printed circuit board electrically connecting the wireless communication circuit and the at least one conductive portion. According to an example embodiment, the wireless communication circuit may be configured to communicate with an external electronic device in a specified frequency band through the at least one conductive portion.

An electronic device according to an example embodiment may may utilize a conductive portion of a housing of an electronic device as an antenna radiator.

An electronic device according to an example embodiment may reduce a space required to dispose an antenna module, by providing an antenna structure using a conductive portion of a housing, instead of the antenna module disposed in its inner space.

The effects that can be obtained in the disclosure are not limited to those described above, and other effects not mentioned herein will be clearly understood by those having ordinary knowledge in the technical field to which the disclosure belongs from the following description.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
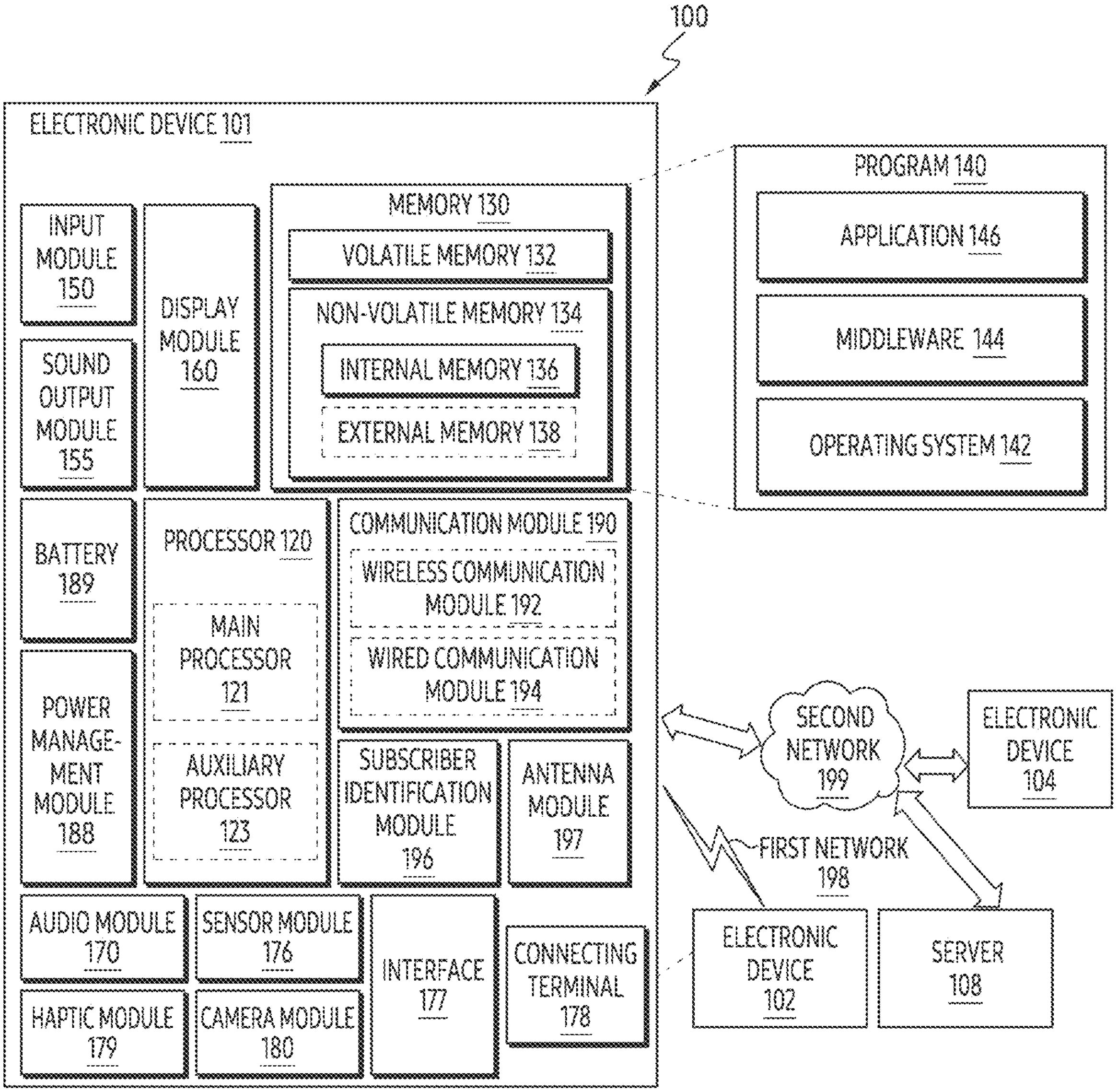
FIG. 1 is a block diagram illustrating an example electronic device in a network environment according to various embodiments.

FIG. 1 is a block diagram illustrating an example electronic device 100 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may include various processing circuitry and/or multiple processors. For example, as used herein, including the claims, the term "processor" may include various processing circuitry, including at least one processor, wherein one or more of at least one processor, individually and/or collectively in a distributed manner, may be configured to perform various functions described herein. As used herein, when "a processor", "at least one processor", and "one or more processors" are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/disclosed functions, e.g., in a distributed manner. At least one processor may execute program instructions to achieve or perform various functions. The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 46.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
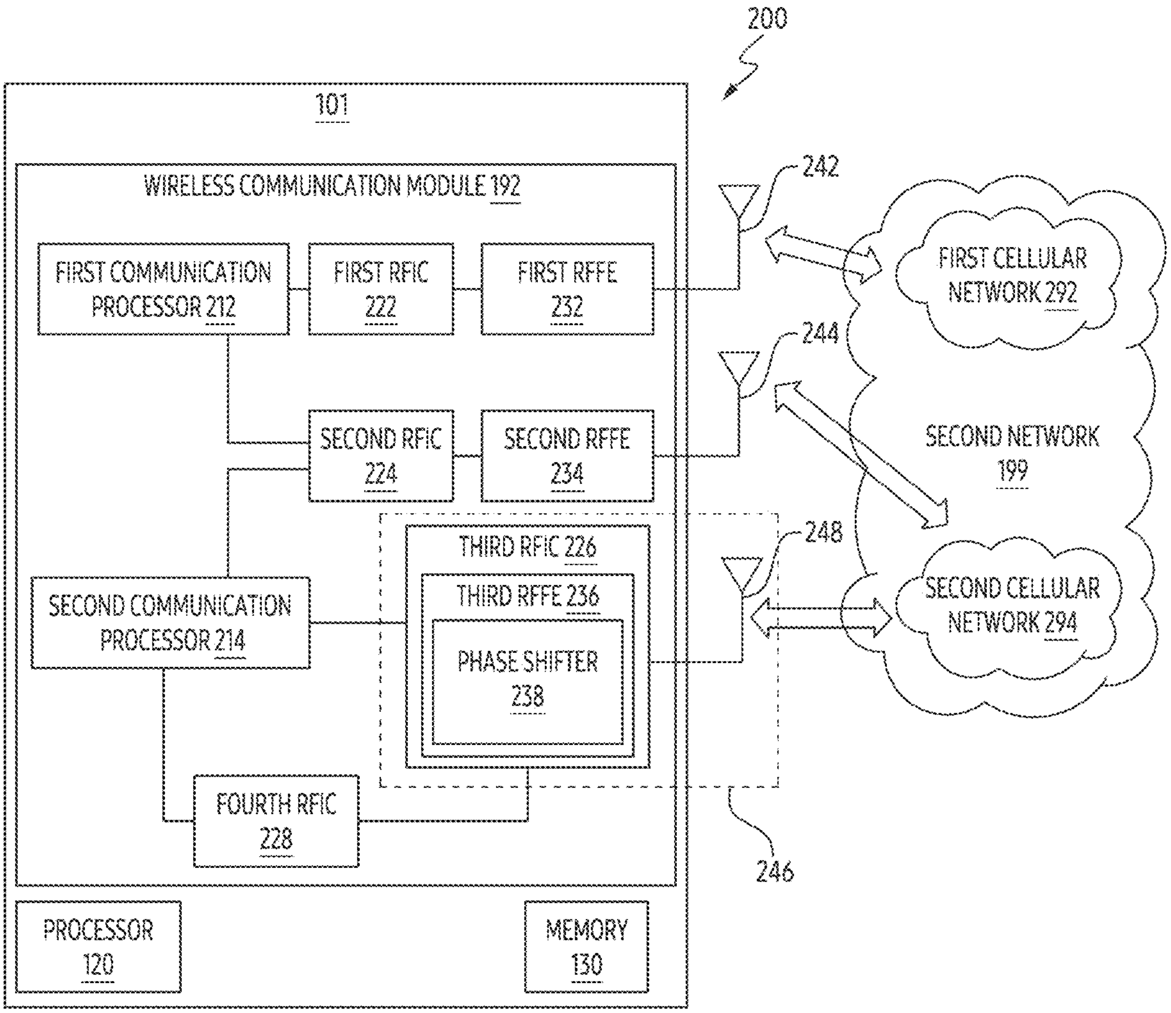
FIG. 2 is a block diagram illustrating an example configuration of an electronic device for supporting legacy network communication and 5G network communication according to various embodiments.

FIG. 2 is a block diagram 200 illustrating an example configuration of the electronic device 101 for supporting legacy network communication and 5G network communication, according to various embodiments.

Referring to FIG. 2, the electronic device 101 may include a first communication processor (e.g., including processing circuitry) 212, a second communication processor (e.g., including processing circuitry) 214, a first radio frequency integrated circuit (RFIC) 222, a second RFIC 224, and a third RFIC 226, a fourth RFIC 228, a first radio frequency front end (RFFE) 232, a second RFFE 234, a first antenna module (e.g., including at least one antenna) 242, a second antenna module (e.g., including at least one antenna) 244, and an antenna 248. The electronic device 101 may further include the processor (e.g., including processing circuitry) 120 and the memory 130. The second network 199 may include a first cellular network 292 and a second cellular network 294. According to an embodiment, the electronic device 101 may further include at least one of the components illustrated in FIG. 1, and the second network 199 may further include at least one other network. According to an embodiment, the first communication processor 212, the second communication processor 214, the first RFIC 222, the second RFIC 224, the fourth RFIC 228, the first RFFE 232, and the second RFFE 234 may comprise at least a part of a wireless communication module 192. According to an embodiment, the fourth RFIC 228 may be omitted or may be included as a part of the third RFIC 226.

The first communication processor 212 may include various processing circuitry and/or multiple processors. For example, as used herein, including the claims, the term "processor" may include various processing circuitry, including at least one processor, wherein one or more of at least one processor, individually and/or collectively in a distributed manner, may be configured to perform various functions described herein. As used herein, when "a processor", "at least one processor", and "one or more processors"

are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/disclosed functions, e.g., in a distributed manner. At least one processor may execute program instructions to achieve or perform various functions, and support the establishment of a communication channel of a band to be used for wireless communication with the first cellular network 292 and legacy network communication through the established communication channel. According to various embodiments, the first cellular network 292 may be a legacy network including a 2nd generation (2G), 3rd generation (3G), 4th generation (4G), and/or long-term evolution (LTE) network. The second communication processor 214 may support the establishment of a communication channel corresponding to a specified band (e.g., approximately 6 GHz to 60 GHz) among bands to be used for wireless communication with the second cellular network 294, and 5G network communication through the established communication channel. According to various embodiments, the second cellular network 294 may be a 5G network defined by 3GPP. Additionally, according to an embodiment, the first communication processor 212 or the second communication processor 214 may include various processing circuitry and/or multiple processors. For example, as used herein, including the claims, the term "processor" may include various processing circuitry, including at least one processor, wherein one or more of at least one processor, individually and/or collectively in a distributed manner, may be configured to perform various functions described herein. As used herein, when "a processor", "at least one processor", and "one or more processors" are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/disclosed functions, e.g., in a distributed manner. At least one processor may execute program instructions to achieve or perform various functions, and support the establishment of a communication channel corresponding to another specified band (e.g., approximately 6 GHz or less) among bands to be used for wireless communication with the second cellular network 294, and 5G network communication through the established communication channel. According to an embodiment, the first communication processor 212 and the second communication processor 214 may be implemented in a single chip or a single package. According to various embodiments, the first communication processor 212 or the second communication processor 214 may be formed with the processor 120, the coprocessor 123 of FIG. 1, or the communication module 190 in a single chip or a single package.

Upon transmission, the first RFIC 222 may convert a baseband signal generated by the first communication processor 212 into a radio frequency (RF) signal of approximately 700 MHz to approximately 3 GHz used in the first cellular network 292 (e.g., a legacy network). Upon reception, an RF signal may be obtained from the first cellular network 292 (e.g., a legacy network) through an antenna (e.g., the first antenna module 242), and may be preprocessed through an RFFE (e.g., the first RFFE 232). The first RFIC 222 may convert the preprocessed RF signal into a baseband signal so as to be processed by the first communication processor 212.

Upon transmission, the second RFIC 224 may convert a baseband signal generated by the first communication processor 212 or the second communication processor 214 into an RF signal (hereinafter, referred to as a 5G Sub6 RF signal) of the Sub6 band (e.g., approximately 6 GHz or less) used in the second cellular network 294 (e.g., the 5G network). Upon reception, a 5G Sub6 RF signal may be obtained from the second cellular network 294 (e.g., the 5G network) through an antenna (e.g., the second antenna module 244), and may be preprocessed through an RFFE (e.g., the second RFFE 234). The second RFIC 224 may convert the preprocessed 5G Sub6 RF signal into a baseband signal so as to be processed by a corresponding one of the first communication processor 212 or the second communication processor 214.

The third RFIC 226 may convert a baseband signal generated by the second communication processor 214 into an RF signal (hereinafter, referred to as a 5G Above6 RF signal) of the 5G Above6 band (e.g., approximately 6 GHz to approximately 60 GHz) to be used in the second cellular network 294 (e.g., the 5G network). Upon reception, a 5G Above6 RF signal may be obtained from the second cellular network 294 (e.g., the 5G network) through an antenna (e.g., the antenna 248), and may be preprocessed through the third RFFE 236. For example, the third RFFE 236 may perform preprocessing of the signal using a phase shifter 238. The third RFIC 226 may convert the preprocessed 5G Above6 RF signal into a baseband signal so as to be processed by the second communication processor 214. According to an embodiment, the third RFFE 236 may be formed as a part of the third RFIC 226.

According to an embodiment, the electronic device 101 may include the fourth RFIC 228 separately from or at least as a part of the third RFIC 226. In this case, the fourth RFIC 228 may convert the baseband signal generated by the second communication processor 214 into an RF signal (hereinafter, referred to as an intermediate frequency (IF) signal) of an intermediate frequency band (e.g., approximately 9 GHz to approximately 11 GHz), and then transmit the IF signal to the third RFIC 226. The third RFIC 226 may convert the IF signal into a 5G Above6 RF signal. Upon reception, a 5G Above6 RF signal may be received from the second cellular network 294 (e.g., the 5G network) through an antenna (e.g., the antenna 248), and may be converted into an IF signal by the third RFIC 226. The fourth RFIC 228 may convert the IF signal into the baseband signal so as to be processed by the second communication processor 214.

According to an embodiment, the first RFIC 222 and the second RFIC 224 may be implemented as a single chip or at least a part of a single package. According to an embodiment, the first RFFE 232 and the second RFFE 234 may be implemented as a single chip or at least a part of a single package. According to an embodiment, at least one of the first antenna module 242 or the second antenna module 244 may be omitted or combined with another antenna module to process RF signals of a plurality of corresponding bands.

According to an embodiment, the third RFIC 226 and the antenna 248 may be disposed on the same substrate to form a third antenna module 246. For example, the wireless communication module 192 or the processor 120 may be disposed on a first substrate (e.g., a main PCB). In this case, the third RFIC 226 may be disposed in a partial region (e.g., the lower surface) of a second substrate (e.g., a sub PCB) separate from the first substrate, and the antenna 248 may be disposed in another partial region (e.g., the upper surface) to form the third antenna module 246. According to an embodiment, the antenna 248 may include, for example, an antenna array that may be used for beamforming. By disposing the third RFIC 226 and the antenna 248 on the same substrate, it is possible to reduce the length of the transmission line therebetween. This, for example, may reduce the loss (e.g., attenuation) of a signal in a high frequency band (e.g., approximately 6 GHz to approximately 60 GHz) used for 5G network communication by the transmission line. Accordingly, the electronic device 101 may improve the quality or speed of communication with the second cellular network 294 (e.g., the 5G network).

The second cellular network 294 (e.g., the 5G network) may be operated independently of (e.g., Stand-Alone (SA)) or operated to be connected to (e.g., Non-Stand Alone (NSA)) the first cellular network 292 (e.g., the legacy network). For example, in the 5G network, there may be only an access network (e.g., 5G radio access network (RAN) or next-generation RAN (NG RAN)) and no core network (e.g., next-generation core (NGC)). In this case, after accessing the access network of the 5G network, the electronic device 101 may access an external network (e.g., the Internet) under the control of a core network (e.g., evolved packed core (EPC)) of the legacy network. Protocol information for communication with the legacy network (e.g., LTE protocol information) or protocol information for communication with the 5G network (e.g., New Radio (NR) protocol information) may be stored in the memory 230 and may be accessed by other components (e.g., the processor 120, the first communication processor 212, or the second communication processor 214).

Figure 3A:
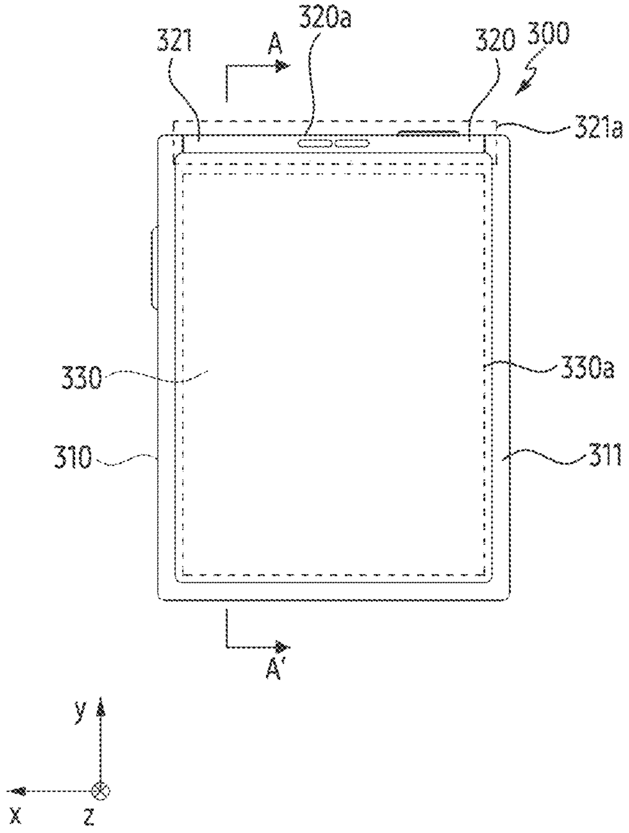
FIG. 3A is a front view of a first state of an electronic device according to various embodiments.
Figure 3B:
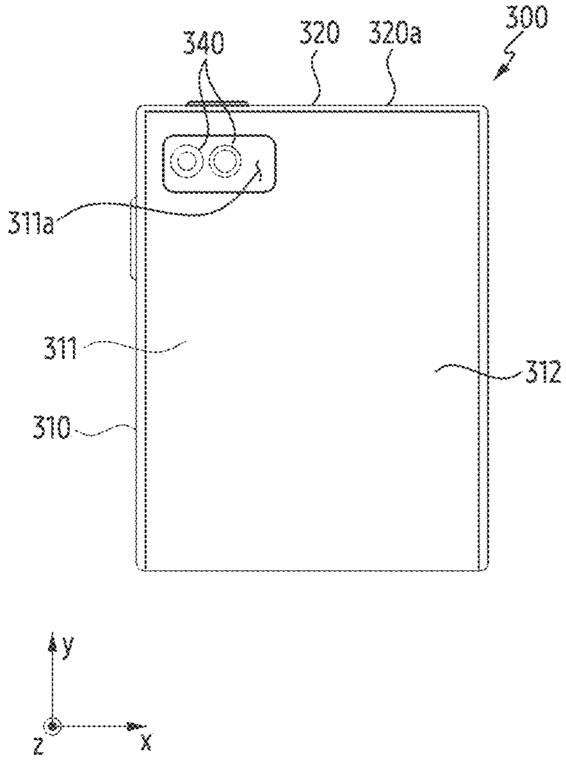
FIG. 3B is a rear view of a first state of an electronic device according to various embodiments.
Figure 3C:
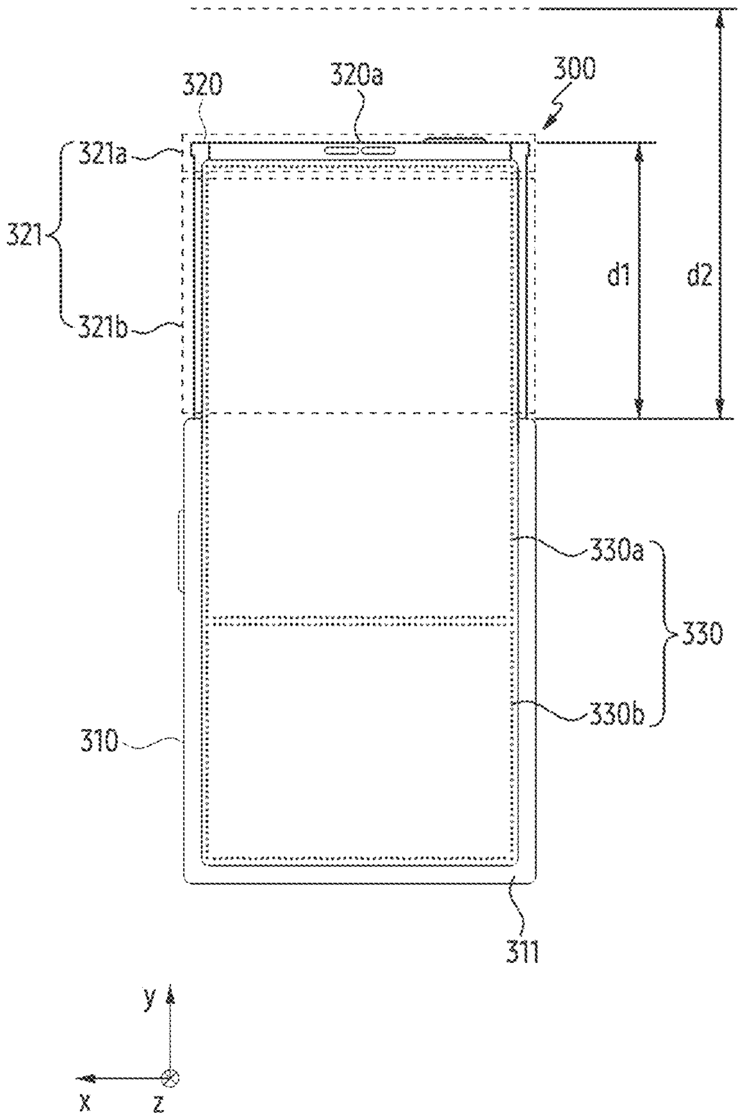
FIG. 3C is a front view of a second state of an electronic device according to various embodiments.
Figure 3D:
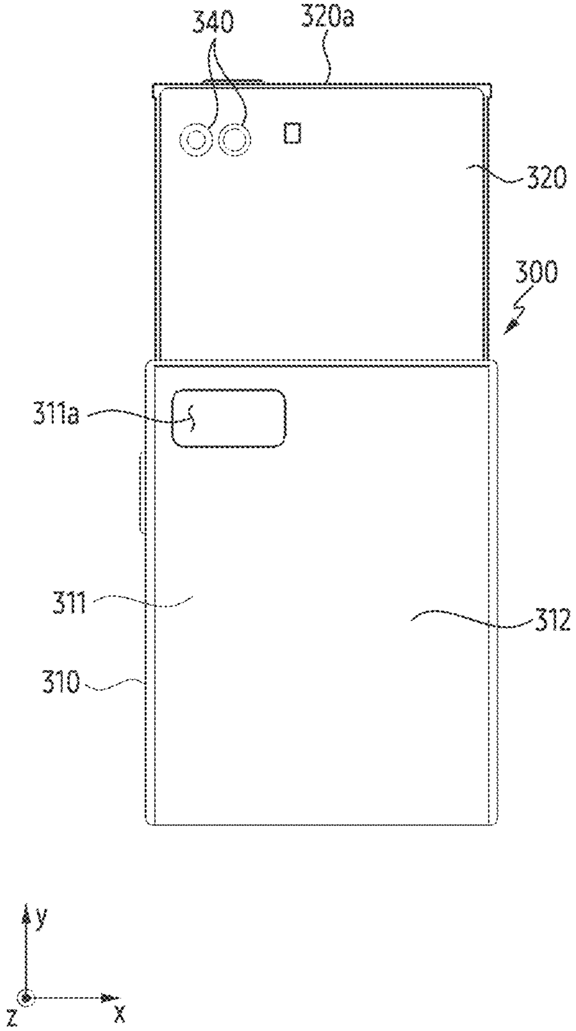
FIG. 3D is a rear view of a second state of an electronic device according to various embodiments.

FIG. 3A is a front view of a first state of an electronic device according to various embodiments, FIG. 3B is a rear view of a first state of an electronic device according to various embodiments, FIG. 3C is a front view of a second state of an electronic device according to various embodiments, and FIG. 3D is a rear view of a second state of an electronic device according to various embodiments.

Referring to FIG. 3A, FIG. 3B, FIG. 3C and FIG. 3D, an electronic device 300 (e.g., the electronic device 101 of FIG. 1) according to an embodiment may include a first housing 310, a second housing 320, a display 330 (e.g., the display module 160 of FIG. 1), and a camera 340 (e.g., the camera module 180 of FIG. 1). According to an embodiment, the second housing 320 may be slidable with respect to the first housing 310. For example, the second housing 320 may move within a specified distance with respect to the first housing 310 in a first direction (e.g., +y direction). When the second housing 320 moves along the first direction, a distance between a side surface 320*a* of the second housing 320 facing the first direction and the first housing 310 may increase. As another example, the second housing 320 may move with respect to the first housing 310 within a range of a specified distance in a second direction (e.g., −y direction) opposite to the first direction. When the second housing 320 moves along the second direction, the distance between the side surface 320*a* of the second housing 320 facing the first direction and the first housing 310 may decrease. According to an embodiment, the second housing 320 may linearly reciprocate with respect to the first housing 310 by relatively sliding with respect to the first housing 310. For example, at least a portion of the second housing 320 may be pulled into or out of the first housing 310.

According to an embodiment, the electronic device 300 may be referred to as a "slidable electronic device", as the second housing 320 is designed to be slidable with respect to the first housing 310. According to an embodiment, the electronic device 300 may be referred to as a "rollable electronic device", as at least a portion of the display 330 is designed to be rolled into the second housing 320 (or the first housing 310) based on a sliding movement of the second housing 320.

According to an embodiment, a first state of the electronic device 300 may be referred to as a state in which the second housing 320 is moved in the second direction (e.g., a retracted state or a slide-in state). For example, in the first state of the electronic device 300, the second housing 320 may be movable in the first direction, but may not be movable in the second direction any more. In the first state of the electronic device 300, the distance between the side surface 320*a* of the second housing 320 and the first housing 310 may increase as the second housing 320 moves, but may not decrease. For another example, in the first state of the electronic device 300, a portion of the second housing 320 may be pulled out into the first housing 310, but may not be pulled in any more. According to an embodiment, the first state of the electronic device 300 may be referred to as a state in which the second area 330*b* of the display 330 is not visually viewed from an outside of the electronic device 300. For example, in the first state of the electronic device 300, the second area 330*b* of the display 330 may be located inside an inner space (not shown) of the electronic device 300 formed by the first housing 310 and/or the second housing 320, so that it may not be visible from the outside of the electronic device 300.

According to an embodiment, a second state of the electronic device 300 may be referred to as a state in which the second housing 320 is moved in the first direction (e.g., a retracted state or a slide-in state). For example, in the second state of the electronic device 300, the second housing 320 may be movable in the second direction but may not be movable in the first direction any more. In the second state of the electronic device 300, the distance between the side surface 320*a* of the second housing 320 and the first housing 310 may decrease as the second housing 320 moves, but may not increase. For another example, in the second state of the electronic device 300, a portion of the second housing 320 may be slidable into the first housing 310, but may not be slidable out of the first housing 310. According to an embodiment, the second state of the electronic device 300 may be referred to as a state in which the second area 330*b* of the display 330 is visually viewable from the outside of the electronic device 300. For example, in the second state of the electronic device 300, the second area 330*b* of the display 330 may be drawn out of an inner space of the electronic device 300 and may be visible from the outside of the electronic device 300.

According to an embodiment, when the second housing 320 moves from the first housing 310 in the first direction, at least a portion of the second housing 320 and/or the second area 330*b* of the display 330 may be pulled out from the first housing 310 by a pull-out length d1 corresponding to a movement distance of the second housing 320. According to an embodiment, the second housing 320 may reciprocate within a designated distance d2. According to an embodiment, the pull-out length d1 may have a size in a range of approximately 0 to the designated distance d2.

According to an embodiment, the state of the electronic device 300 may be convertible between the first state and/or the second state, by means of either a manual operation by a user or an automatic operation by a driving module (not shown) disposed inside the first housing 310 or the second housing 320. According to an embodiment, an operation of the driving module may be triggered based on a user input. According to an embodiment, the user input for triggering the operation of the driving module may include a touch input, a force touch input, and/or a gesture input via display 330. According to an embodiment, the user input for triggering the operation of the driving module may include a voice input by a user or an input of a physical button exposed out of the first housing 310 or the second housing 320. According to an embodiment, the driving module may be driven in a semi-automatic manner in which an operation is triggered upon detection of a manual operation by an external force of the user.

According to an embodiment, the first state of the electronic device 300 may be referred to as a first shape, and the second state of the electronic device 300 may be referred to as a second shape. For example, the first shape may include a normal state, a reduced state, or a closed state, and the second shape may include an open state. According to an embodiment, the electronic device 300 may form a third state (e.g., an intermediate state) that is a state in between the first state and the second state. For example, the third state may be referred to as a third shape, and the third shape may include a free stop state.

According to an embodiment, the display 330 may be visible or viewable from the outside through a front direction (e.g., −z direction) of the electronic device 300 so as to display visual information to the user. For example, the display 330 may include a flexible display. According to an embodiment, the display 330 may be disposed in the second housing 320 and may be pulled out of an inner space (not shown) of the electronic device 300 or may be pulled into the inner space of the electronic device 300, as the second housing 320 moves. The inner space of the electronic device 300 may refer to a space inside the first housing 310 and the second housing 320 formed by coupling the first housing 310 and the second housing 320. For example, in the first state of the electronic device 300, at least a portion of the display 330 may be rolled into the inner space of the electronic device 300 and fully inserted into the inner space. When the second housing 320 moves in the first direction in a state in which at least a portion of the display 330 is inserted into the inner space of the electronic device 300, at least a portion of the display 330 may be pulled out from the inner space of the electronic device 300. For another example, when the second housing 320 moves in the second direction, at least a portion of the display 330 may be rolled into the electronic device 300 to be fully inserted into the inner space of the electronic device 300. As the at least a portion of the display 330 is pulled-out or pulled-in, the area of the display 330 visible from the outside of the electronic device 300 may be expanded or reduced. According to an embodiment, the display 330 may include a first area 330*a* and a second area 330*b*.

According to an embodiment, the first area 330*a* of the display 330 may refer to an area of the display 330 that can be fixedly viewed from the outside of the electronic device 300, regardless of whether the electronic device 300 is in the second state or the first state. For example, the first area 330*a* may refer to a partial area of the display 330 that is not rolled into the inner space of the electronic device 300. According to an embodiment, when the second housing 320 moves, the first area 330*a* may move together with the second housing 320. For example, when the second housing 320 moves in the first direction or the second direction, the first area 330*a* may move in the first direction or the second direction, on the front surface of the electronic device 300 together with the second housing 320.

According to an embodiment, the second area 330*b* of the display 330 may be connected to the first area 330*a*, and may be drawn into the inner space of the electronic device 300 or may be drawn out of the inner space of the electronic device 300, as the second housing 320 moves. For example, the second area 330*b* of the display 330 may be rolled into the inner space of the electronic device 300 in a rolled state in the first state of the electronic device 300. The second area 330*b* of the display 330 may be inserted into the inner space of the electronic device 300 in the first state of the electronic device 300 and may not be visible from the outside. As another example, the second area 330*b* of the display 330 may be drawn out of the inner space of the electronic device 300 in the second state of the electronic device 300. The second area 330*b* of the display 330 may be visible from the outside of the electronic device 300 in the second state.

According to an embodiment, in the first state of the electronic device 300, the display area of the display 330 visible from the outside of the electronic device 300 may include only the first area 330*a* of the display 330. In the second state of the electronic device 300, the display area of the display 330 visible from the outside of the electronic device 300 may include the first area 330*a* and at least a portion of the second area 330*b* of the display 330.

According to an embodiment, the first housing 310 of the electronic device 300 may include a book cover 311 surrounding the inner space of the first housing 310 and a rear plate 312 surrounding a rear surface of the book cover 311. The second housing 320 of the electronic device 300 may include a front cover 321 surrounding the inner space of the electronic device 300.

According to an embodiment, the front cover 321 may include a first cover area 321*a* of the front cover 321 that is not inserted into the first housing 310 and a second cover area 321*b* that is inserted into or pulled out from the first housing 310. The first cover area 321*a* of the front cover 321 may be all the time visible from the outside regardless of whether the electronic device 300 is in either the second state or the first state. According to an embodiment, at least a portion of the first cover area 321*a* of the front cover 321 may form a side surface 320*a* of the second housing 320. According to an embodiment, the second cover area 321*b* of the second housing 320 may not be visible in the first state, but may be visible in the second state.

The camera 340 may obtain an image of a subject based on receiving light from the outside of the electronic device 300. According to an embodiment, the camera 340 may include one or more lenses, an image sensor, and/or an image signal processor. According to an embodiment, the camera 340 may be disposed in the second housing 320 to face the rear surface of the electronic device 300 opposite to the front surface of the electronic device 300 on which the first area 330*a* of the display 330 is disposed. For example, the camera 340 may be disposed on the front cover 321 of the second housing 320, and may be visible from the outside of the electronic device 300 through an opening 311*a* formed in the book cover 311, when the electronic device 300 is in the first state. As another example, the camera 340 may be disposed on the front cover 321 of the second housing 320, and may be hidden by the book cover 311 and/or the rear plate 312 when the electronic device 300 is in the first state, and thus may not be visible from the outside of the electronic device 300.

According to an embodiment, the camera 340 may include multiple cameras. For example, the camera 340 may include a wide-angle camera, an ultra-wide-angle camera, a telephoto camera, a proximity camera, and/or a depth camera. However, the camera 340 is not necessarily limited to including a plurality of cameras, and may include one camera.

According to an embodiment, the camera 340 may further include a camera (not shown) facing the front surface of the electronic device 300 on which the first area 330*a* of the display 330 is disposed. When the camera 340 faces the front surface of the electronic device 300, the camera 340 may be an under display camera (UDC) disposed below the display 330 (e.g., in +z direction from the display 330), but the disclosure is not limited thereto.

According to an embodiment, the electronic device 300 may include a sensor module (not illustrated) and/or a camera module (not illustrated) disposed under the display 330. The sensor module may detect an external environment based on information (e.g., light) received through the display 330. According to an embodiment, the sensor module may include at least one of a receiver, a proximity sensor, an ultrasonic sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, a motor encoder, or an indicator. According to an embodiment, at least some sensor modules of the electronic device 300 may be visually visible from the outside through a partial area of the display 330. According to an embodiment, the electronic device 300 may detect a pull-out length (e.g., length A), using the sensor module. According to an embodiment, the electronic device 300 may generate pull-out information about an extent of the pull-out detected by the sensor. For example, the electronic device 300 may detect and/or identify the extent of the pull-out of the second housing 320 using the pull-out information. According to an embodiment, the pull-out information may include information about a pull-out length of the second housing 320.

According to an embodiment, the shape of coupling of the first housing 310 and the second housing 320 is not limited to the shape and coupling as illustrated in FIGS. 3A, 3B, 3C, and 3D, and may be implemented by a combination and/or a coupling of other shapes or components.

Figure 4A:
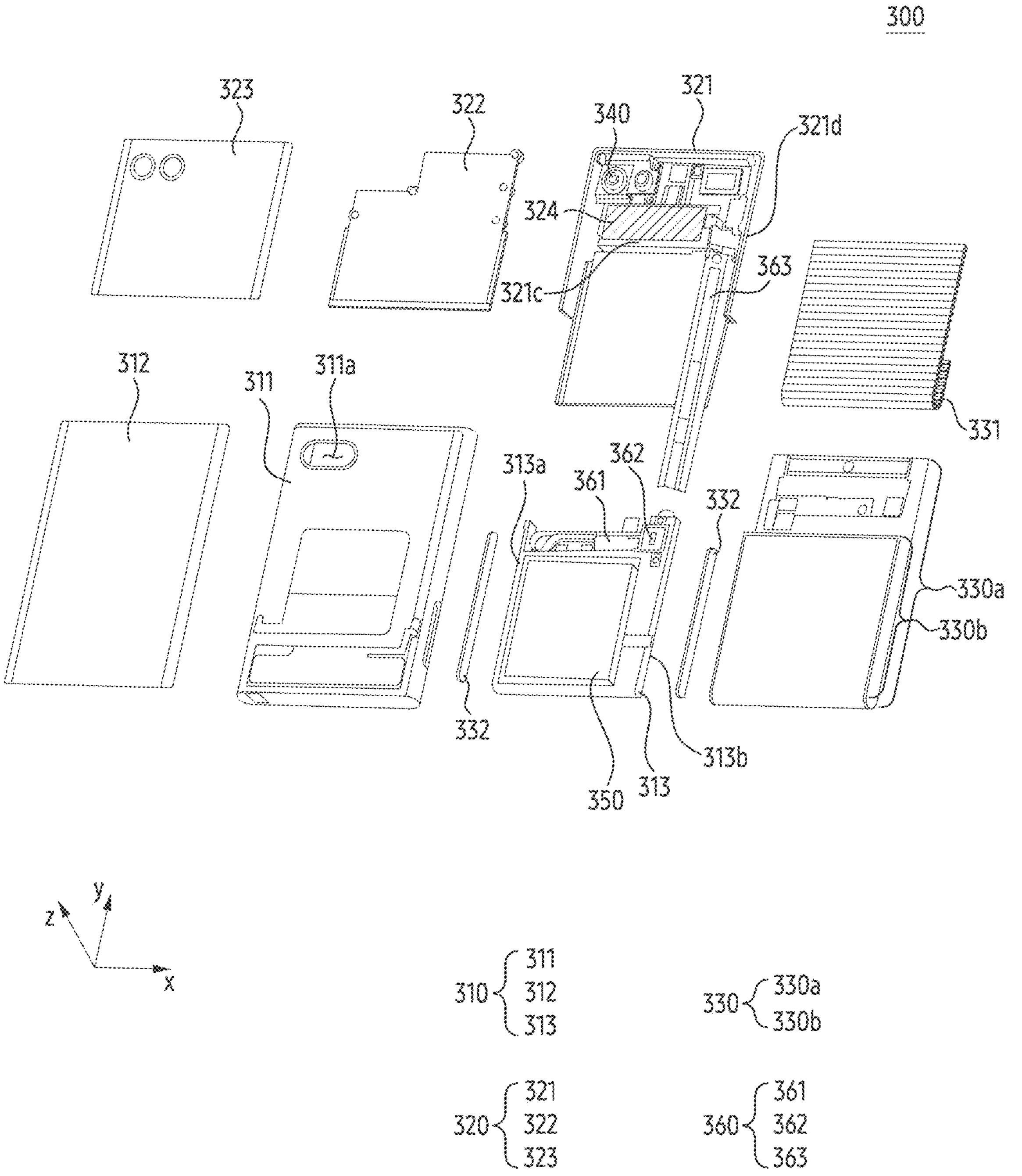
FIG. 4A is an exploded perspective view of an electronic device according to various embodiments.
Figure 4B:
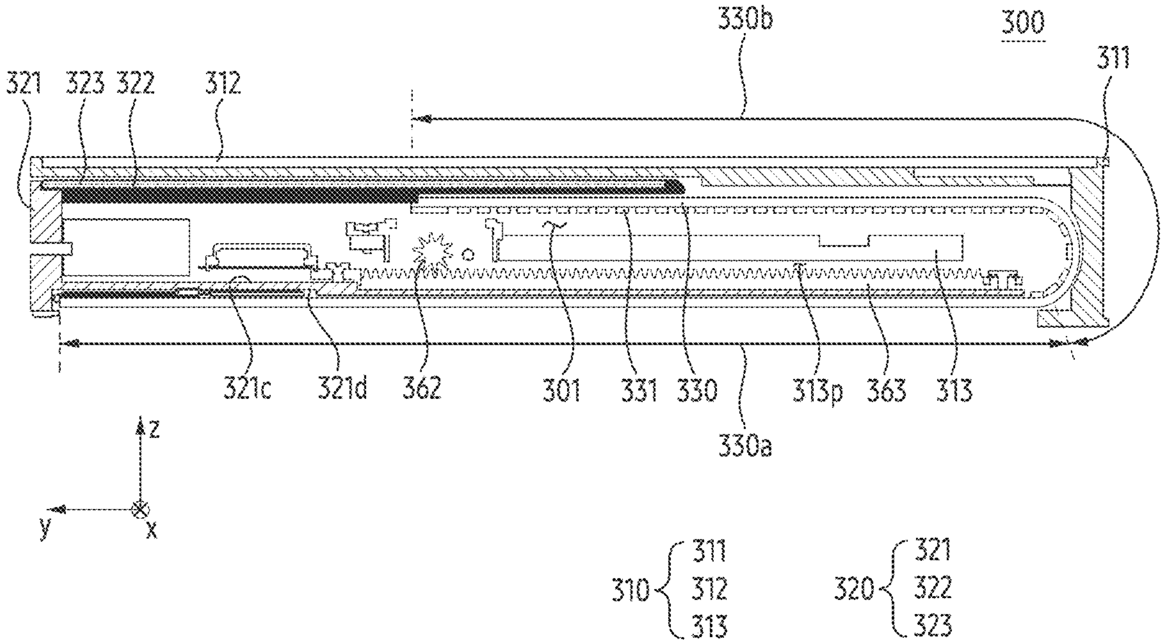
FIG. 4B is a cross-sectional view illustrating an example of an electronic device taken along line A-A' of FIG. 3A, according to various embodiments.

FIG. 4A is an exploded perspective view of an electronic device according to various embodiments, and FIG. 4B is a cross-sectional view illustrating an example of an electronic device taken along line A-A' of FIG. 3A according to various embodiments.

Referring to FIGS. 4A and 4B, the electronic device 300 according to an embodiment may include a first housing 310, a second housing 320, a display 330, a camera 340, a battery 350 (e.g., the battery 189 of FIG. 1), and a driver 360. According to an embodiment, the first housing 310 and the second housing 320 may be coupled to each other to form an inner space 301 of the electronic device 300. For example, in the first state of the electronic device 300, the second area 330*b* of the display 330 may be accommodated in the inner space 301.

According to an embodiment, the first housing 310 may include a book cover 311, a rear plate 312, and a frame cover 313. According to an embodiment, the book cover 311, the rear plate 312, and the frame cover 313 included in the first housing 310 may be coupled to each other and may not move when the second housing 320 moves with respect to the first housing 310. According to an embodiment, the book cover 311 may form at least a portion of the outer surface of the electronic device 300. For example, the book cover 311 may form at least a portion of the side surface of the electronic device 300 and at least a portion of the rear surface of the electronic device 300. According to an embodiment, the rear plate 312 may provide a surface on which the rear plate 312 is seated. The rear plate 312 may be seated on one surface of the book cover 311.

According to an embodiment, the frame cover 313 may support components inside the electronic device 300. For example, the frame cover 313 may accommodate at least a portion of the battery 350 and the driver 360. The battery 350 and the driver 360 may be accommodated in at least one of a recess or a hole included in the frame cover 313. According to an embodiment, the frame cover 313 may be surrounded by the book cover 311. For example, in the first state of the electronic device 300, one surface 313*a* of the frame cover 313 on which the battery 350 is disposed may face the book cover 311 and/or the second area 330*b* of the display 330. For another example, in the first state of the electronic device 300, the other surface 313*b* of the frame cover 313 facing the one surface 313*a* of the frame cover 313 may face the first area 330*a* or the front cover 321 of the display 330. For example, the frame cover 313 may include an aluminum material, but the disclosure is not limited thereto.

According to an embodiment, the second housing 320 may include a front cover 321, a rear cover 322, and a slide cover 323. According to an embodiment, the front cover 321, the rear cover 322, and the slide cover 323 may be coupled to each other to move together with the second housing 320 when the second housing 320 moves relative to the first housing 310. The front cover 321 may support internal components of the electronic device 300. For example, a printed circuit board 324, on which electronic components (e.g., the processor 120 of FIG. 1) of the electronic device 300 are disposed, and/or a camera 340 may be disposed on one surface 321*c* of the front cover 321 facing the inner space 301. The other surface 321*d* of the front cover 321 facing the one surface 321*c* of the front cover 321 may face the first area 330*a* of the display 330, when the electronic device 300 is in the first state. According to an embodiment, the rear cover 322 may be coupled to the front cover 321 to protect the components of the electronic device 300 disposed on the front cover 321. For example, the rear cover 322 may cover a portion of the one surface 321*c* of the front cover 321. According to an embodiment, the slide cover 323 may be disposed on the rear cover 322 to form the outer surface of the electronic device 300 together with the rear plate 312 and the book cover 311. The slide cover 323 may be coupled to one surface of the rear cover 322 to protect the rear cover 322 and/or the front cover 321.

According to an embodiment, when the electronic device 300 is in the first state, at least a portion of the display 330 may be rolled into the inner space 301 to be bent. According to an embodiment, the display 330 may be configured to cover at least a portion of the frame cover 313 and at least a portion of the front cover 321. For example, when the electronic device 300 is in the first state, the display 330 may cover the other surface 321*d* of the front cover 321 and pass through between the front cover 321 and the book cover 311, thereby extending toward the inner space 301. The display 330 may surround the frame cover 313 after passing through between the front cover 321 and the book cover 311. The display 330 may cover one surface 313*a* of the frame cover 313 in the inner space 301. According to an embodiment, when the second housing 320 moves in the first direction, the second area 330*b* of the display 330 may be pulled-out from the inner space 301. For example, as the second housing 320 moves in the second direction, the display 330 may pass between the front cover 321 and the book cover 311 and be pulled out of the inner space 301.

According to an embodiment, the electronic device 300 may include a support bar 331 and a guide rail 332 for supporting the display 330. For example, the support bar 331 may include a plurality of bars coupled to each other, and may be manufactured in a shape corresponding to the shape of the second area **330*b* of the display 330. According to an embodiment, as the display 330 moves, the support bar 331 may move together with the display 330. According to an embodiment, in the first state in which the second area 330*b* of the display 330 is wound up within the inner space 301, the support bar 331 may be wound up within the inner space 301 together with the second area 330*b* of the display 330. As the second housing 320 moves in the first direction, the support bar 331 may move together with the second area 330*b* of the display 330. According to an embodiment, the guide rail 332 may guide a movement of the support bar 331. For example, as the display 330 moves, the support bar 331 may move along the guide rail 332 coupled to the frame cover 313. According to an embodiment, the guide rail 332 may be coupled to the frame cover 313. For example, the guide rail 332 may include a plurality of guide rails 332 disposed to be spaced apart from each other at both edges of the frame cover 313** spaced apart from each other in a third direction (e.g., +x direction) perpendicular to the first direction.

According to an embodiment, the driver 360 may provide a driving force to the second housing 320 so that the second housing 320 may move relative to the first housing 310. According to an embodiment, the driver 360 may include a motor 361, a pinion gear 362, and a rack gear 363. The motor 361 may receive power from the battery 350 and provide the driving force to the second housing 320. According to an embodiment, the motor 361 may be disposed in the first housing 310, so that it may not move, when the second housing 320 moves with respect to the first housing 310. For example, the motor 361 may be disposed in a recess formed in the frame cover 313. According to an embodiment, the pinion gear 362 may be coupled to the motor 361 and may rotate by the driving force provided from the motor 361. According to an embodiment, the rack gear 363 may be engaged with the pinion gear 362 and may move according to rotation of the pinion gear 362. For example, the rack gear 363 may linearly reciprocate in either the first direction or the second direction as the pinion gear 362 rotates. According to an embodiment, the rack gear 363 may be disposed in the second housing 320. For example, the rack gear 363 may be coupled to the front cover 321 included in the second housing 320. According to an embodiment, the rack gear 363 may be movable inside an operation space **313*p* formed in the frame cover 313**.

According to an embodiment, when the pinion gear 362 rotates in the first rotational direction (e.g., a clockwise direction in FIG. 4B), the rack gear 363 may move in the first direction (e.g., +y direction). When the rack gear 363 moves in the first direction, the second housing 320 coupled to the rack gear 363 may move in the first direction. As the second housing 320 moves in the first direction, the display area of the display 330 visible from the outside of the electronic device 300 may be expanded. When the pinion gear 362 rotates in the second rotational direction (e.g., a counter-clockwise direction in FIG. 4B), the rack gear 363 may move in the second direction (e.g., −y direction). When the rack gear 363 moves in the second direction, the second housing 320 coupled to the rack gear 363 may move in the second direction. As the second housing 320 moves in the second direction, the display area of the display 330 visible from the outside of the electronic device 300 may be reduced.

In the foregoing description, it has been described that the motor 361 and the pinion gear 362 are disposed in the first housing 310 and the rack gear 363 is disposed in the second housing 320, but embodiments may not be limited thereto. According to embodiments, the motor 361 and the pinion gear 362 may be disposed in the second housing 320, and the rack gear 363 may be disposed in the first housing 310.

Figure 5A:
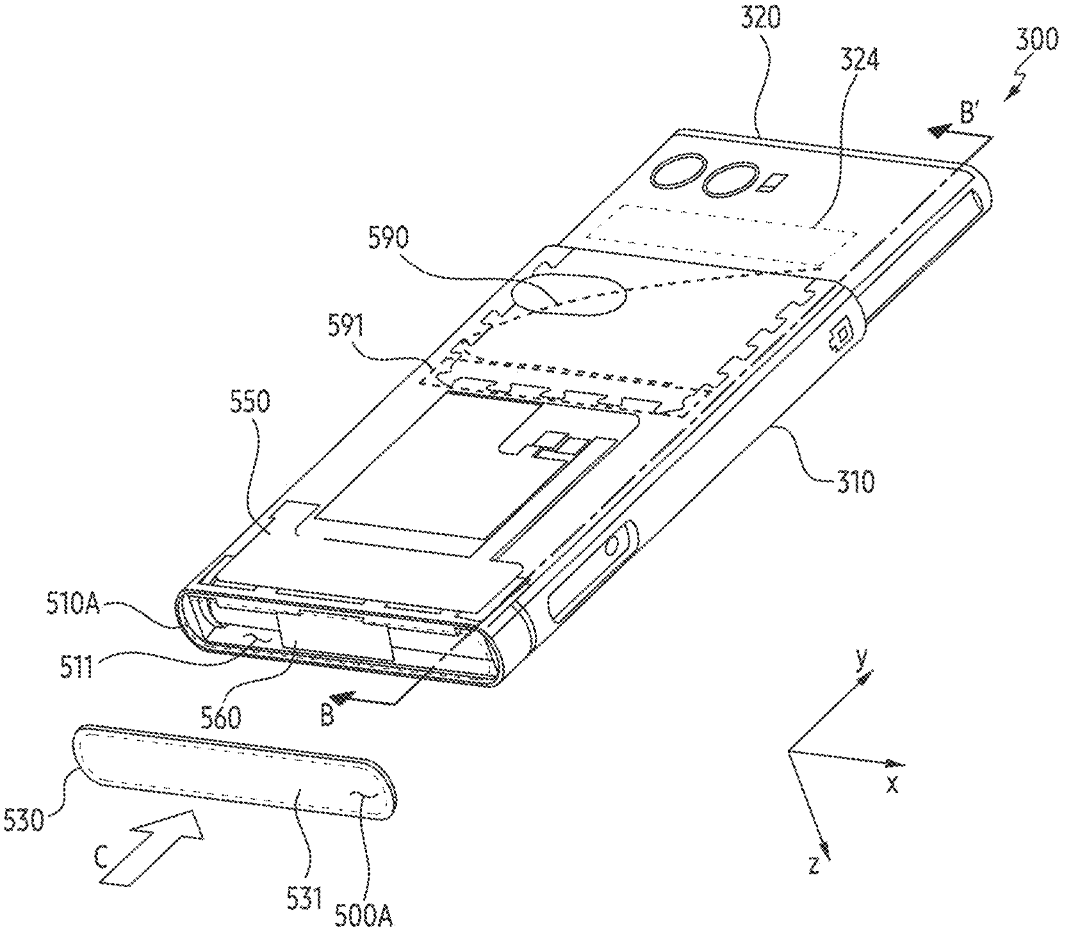
FIG. 5A is a perspective view illustrating a state in which a rear plate of an electronic device is removed and a side surface of a first housing is separated, according to various embodiments.

FIG. 5A is a perspective view illustrating a state in which a rear plate of an electronic device is removed and a side surface of the first housing is separated according to various embodiments.

Referring to FIG. 5A, the electronic device 300 may include a first housing 310, a second housing 320, a side member 530, a first printed circuit board 324 (e.g., the printed circuit board 324 of FIG. 4A), and a second printed circuit board 550.

According to an embodiment, the first housing 310 may be a fixed housing of the electronic device 300 and may accommodate therein a portion of the second housing 320. The first housing 310 may be referred to as an outer housing. The second housing 320 may be referred to as an inner housing.

According to an embodiment, the second housing 320 may linearly reciprocate with respect to the first housing 310. The second housing 320 may be coupled to the first housing 310 so that it may be movable in the first direction (+y direction) or the second direction (−y direction) opposite to the first direction (+y direction), with respect to the first housing 310.

The interior of the first housing 310 and the interior of the second housing 320 may be connected to each other. As the second housing 320 moves, a space formed by the first housing 310 and the second housing 320 may change. Various components of the electronic device 300 may be disposed in the space formed by the first housing 310 and the second housing 320. The components may include a part (e.g., the second area **330*b* of FIG. 3C) of the display 330 (e.g., the display 330 of FIG. 3A), a battery, a driver (e.g., the driver 360 of FIG. 4A), or a printed circuit board 324**.

According to an embodiment, the side surface of the first housing 310 facing the first direction (+y direction) may be connected to the inside of the second housing 320. The side surface of the first housing 310 facing the second direction (−y direction) may include an opening 511 connected to the inner space formed by the first housing 310 and the second housing 320. The opening 511 may be used in an assembly process of various components of the electronic device 300. For example, in the assembly process, the opening 511 may be used to fasten a component disposed close to the opening 511 among components disposed inside the second housing. The opening 511 may be utilized as a passage to provide electronic components passable through the opening 511 to the inner space.

According to an embodiment, electronic components disposed inside the electronic device 300 may be disposed in the first housing 310 or the second housing 320. For example, the first printed circuit board 324 on which the wireless communication circuit or at least one processor (e.g., the processor 120 of FIG. 1) is arranged may be disposed in the second housing 320. The second printed circuit board 550 electrically connected to electronic components disposed in a lower part of the electronic device 300

(e.g., in the second direction (−y direction)) may be disposed in the first housing 310. The first printed circuit board 324 may be electrically connected to the second printed circuit board 550 through a first flexible printed circuit board 590 and/or a third printed circuit board 591 added thereto.

According to an embodiment, the side member 530 may form at least a portion of the side surface 500A of the first housing 310. The side member 530 may be configured to block the opening 511 connected to the inner space of the first housing 310 and the second housing 320 from the outside. The side member 530 may be coupled to the second housing 320 to be disposed to overlap the opening 511 of the second housing 320. The side member 530 may serve to reduce an inflow of foreign matter into the inner space of the assembled electronic device 300.

According to an embodiment, the side member 530 may include at least one conductive portion 531 forming a portion of the side surface 500A of the first housing 310 facing the second direction (−y direction). The wireless communication circuit disposed on the first printed circuit board 324 may be configured to communicate with an external electronic device in a specified frequency band through the conductive portion 531.

According to an embodiment, the conductive portion 531 may be disposed in a partial area 510A of the opening 511 and may be connected to the second flexible printed circuit board 560. The conductive portion 531 operating as an antenna may be fed with power by the second flexible printed circuit board 560 extending from the second printed circuit board 550.

According to an embodiment, the electronic device 300 may utilize the conductive portion 531 of the side member 530 as an antenna radiator to dispose the antenna radiator outside the housing of the electronic device 300 and not in the inner space thereof. The antenna radiator disposed in the outside may increase a spatial efficiency of the electronic device.

According to an embodiment, the side member 530 may include an opening (not shown). For example, the side member 530 may include an opening for exposing, to the outside, a connector through which a connecting terminal (e.g., the connecting terminal 178 of FIG. 1) may be physically connected to an external electronic device (e.g., the electronic device 102 of FIG. 1). As another example, the side member 530 may include an opening for outputting a sound signal of a sound output module (e.g., the sound output module 155 of FIG. 1) to the outside of the electronic device 101.

Figure 5B:
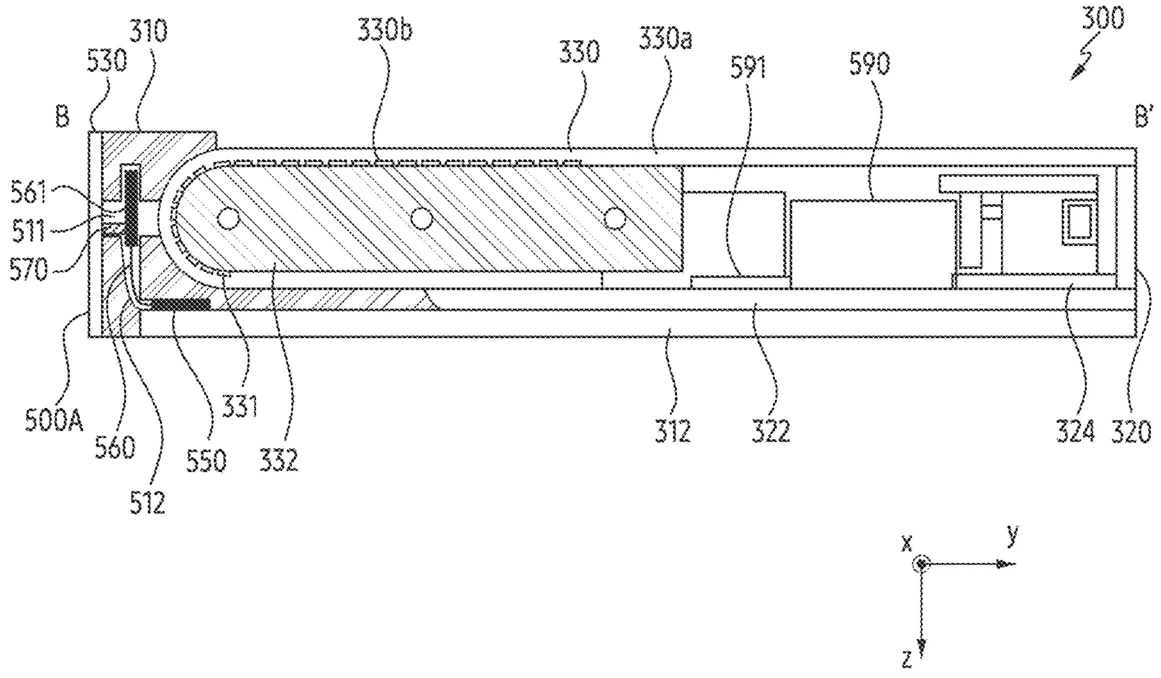
FIG. 5B is a cross-sectional view of the electronic device taken along line B-B' of FIG. 5A according to various embodiments.

FIG. 5B is a cross-sectional view of an electronic device taken along line B-B' of FIG. 5A according to various embodiments.

Referring to FIG. 5B, the electronic device 300 may include a first housing 310, a second housing 320, a display 330, a first printed circuit board 324, a second printed circuit board 550, and a side member 530.

According to an embodiment, the display 330 may be disposed on the second housing 320 so that it may be expanded as the second housing 320 moves in the first direction (+y direction) or may be reduced as the second housing 320 moves in the second direction (−y direction). The display 330 may include a first area 330*a* located on the second housing 320 and a second area 330*b* extending from the first area 330*a*. The first area 330*a* may be disposed on the second housing 320 to maintain a flat surface. The first area 330*a* may be referred to as a planar area. The second area 330*b* may be disposed in the inner space formed by the first housing 310 and the second housing 320, in the first state in which the electronic device 300 is movable in the first direction of the first direction (+y direction) or the second direction (−y direction). As the second housing 320 moves in the first direction (+y direction), the second area 330*b* visible to the outside of the electronic device 300 may increase. The second area 330*b* may be deformed according to a state of the electronic device 300. The second area 330*b* may be referred to as a deformable portion. The terms "visually exposed" and "visible" may be used interchangeably herein and may both include where the display includes a cover plate, cover layer, etc.

According to an embodiment, the electronic device 300 may further include a support bar 331 supporting the second area 330*b* of the display 330 and a guide rail 332 disposed in the inner space formed by the first housing 310 and the second housing 320. The support bar 331 may be attached to the second area 330*b*. The guide rail 332 may guide a movement of the support bar 331. For example, the guide rail 332 may have grooves for accommodating both ends of respective bar-shaped members making up the support bar 331. The groove may be formed along a circumference of the guide rail 332. The support bar 331 may move along the circumference of the guide rail 332 by the groove. The support bar 331 attached to the second area 330*b* of the display 330 may move along the guide rail 332 according to the movement of the second housing 320 in the first direction (+y direction).

According to an embodiment, a side surface of the second housing 320 facing +x direction or −x direction may overlap a side surface of the first housing 310 facing the +x direction or the −x direction. When the side surface of the second housing 320 is utilized as an antenna radiator, the propagation of electromagnetic waves radiated from the side surface of the second housing 320 may be hindered by the side surface of the first housing 310 formed of a conductive material.

According to an embodiment, the guide rail 332 may be disposed on the side surface of the display 330. The guide rail 332 may be disposed toward the side surface of the electronic device 300 parallel to the moving direction (+y direction or −y direction) of the display 330. A space between the display 330 and the side surface of the electronic device 300 extending along the moving direction (+y direction or −y direction) of the display 330 may be formed to be narrow. Such a narrow space between the guide rail 332 and the side surface of the first housing 310 in the +x direction or the −x direction may be insufficient to arrange electronic components. For example, since the guide rail 332 is disposed along an edge of the display 330 close to the side surface, the space between the guide rail 332 and the side surface of the electronic device 300 may be insufficient to dispose the antenna module. Even in case where the side surface of the first housing 310 facing the +x direction or the −x direction of the first housing 310 is used as an antenna radiator, the space between the first housing 310 and the guide rail 332 may be insufficient to arrange a contact or a C-clip for electrically connecting the side surface of the first housing 310 facing the +x direction or the −x direction to a feeding line.

According to an embodiment, between the side surface 500A facing the second direction (−y direction) among the side surfaces of the first housing 310 and the second housing 320 and the deformable portion 330*b* of the display 330 may be a space for disposing a contact or a C-clip for an electrical connection between the antenna radiator and the feeding line. Since there is no conductive material overlapping the side surface facing the second direction (−y direction) of the first housing 310, the side surface facing the second direction (−y direction) of the first housing 310 may be utilized as an antenna radiator.

According to an embodiment, the side member 530 may form the side surface 500A facing the second direction (−y direction) of the first housing 310. The side member 530 may be coupled to the first housing 310. The side member 530 may include a conductive material that operates as an antenna radiator.

According to an embodiment, upon assembling to the first housing 310, the side member 530 may be electrically connected to the wireless communication circuit via an elastic member 570 such as a contact or a C-clip. The elastic member 570 may be disposed in a space defined by the opening 511 formed on the side surface of the first housing 310 facing the second direction (−y direction). A conductive portion of the side member 530 may be fed with power via the elastic member 570. For example, the side member 530 may be connected to the second printed circuit board 550 via the elastic member 570. The second printed circuit board 550 may be disposed at an edge of the first housing 310 facing the second direction (−y direction). The second printed circuit board 550 may be electrically connected to the first printed circuit board 324 via the first flexible printed circuit board 590. The second printed circuit board 550 may be directly connected to the first flexible printed circuit board 590 or may be connected to the first flexible printed circuit board 590 via an additional printed circuit board. As described above, the conductive portion of the side member 530 may be electrically connected to the first printed circuit board 324 in the second housing 320 on which the wireless communication circuit is disposed, via the elastic member 570, the second printed circuit board 550, and the first flexible printed circuit board 590. The side member 530 may receive a signal to be transmitted to an external electronic device from the first printed circuit board 324 on which the wireless communication circuit is disposed.

According to an embodiment, the first housing 310 may include a slot 512 formed at a periphery of the first housing 310. For example, the slot 512 may be formed at the periphery located in the second direction (−y direction) among peripheries of a surface facing the rear plate 312 of the first housing 310. For example, the slot 512 may be formed at the periphery in which the second printed circuit board 550 is disposed. The periphery may be an area including an edge of the rear plate 312 facing the second direction (−y direction). The slot 512 may be formed to be parallel to the edge facing the second direction (−y direction) of the rear plate 312.

According to an embodiment, the slot 512 may be a passage through which the second flexible printed circuit board 560 extending from the second printed circuit board 550 to the elastic member 570 passes. For example, the second flexible printed circuit board 560 may extend from the second printed circuit board 550. The second flexible printed circuit board 560 may be disposed between the second area 330*b* and the conductive portion of the side member 530. The second flexible printed circuit board 560 may extend through the slot 512 and may be exposed toward the side member 530 through the opening 511 formed between the second area 330*b* and the side member 530. The second flexible printed circuit board 560 may further include a connection board 561 exposed through the opening 511.

According to an embodiment, the second printed circuit board 550 and the second flexible printed circuit board 560 may be integrally formed. As another example, one end of the second flexible printed circuit board 560 may include a connector fastened to the second printed circuit board 550. The other end of the second flexible printed circuit board 560 may be connected to the elastic member 570. For example, the elastic member 570 may be disposed on the connection substrate 561 disposed at the other end of the second flexible printed circuit board 560. The connection substrate 561 of the second flexible printed circuit board 560 may include a rigid area and may be fixed to the first housing 310. The elastic member 570 may protrude toward the opening 511. The elastic member 570 may be connected to the conductive portion of the side member 530 when the side member 530 is fastened to the first housing 310. The elastic member 570 may be electrically connected to a feeding point positioned at the conductive portion of the side member 530.

According to an embodiment, the electronic device 300 includes a configuration for movement of the housing, and thus it may be difficult to realize a side surface of the housing parallel to the moving direction of the housing as an antenna or to secure a space for disposing an antenna module. The electronic device 300 according to an embodiment may reduce the influence caused by other conductive material, by utilizing a side surface facing the second direction (−y direction) as an antenna radiator. The electronic device 300 may dispose an antenna contact in an opening formed in the direction facing the side surface to provide a connection with the conductive portion of the side member 530.

Figure 5C:
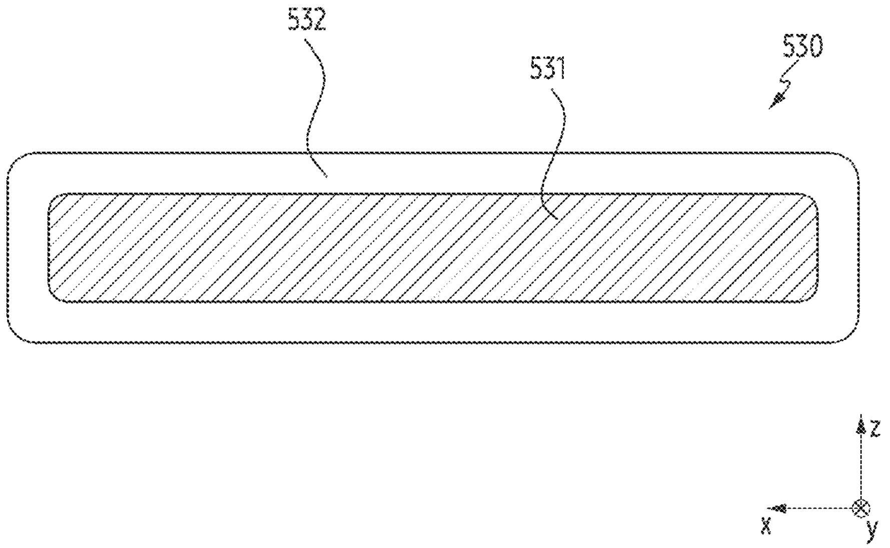
FIG. 5C is a diagram illustrating a side member of a first housing according to various embodiments.
Figure 5D:
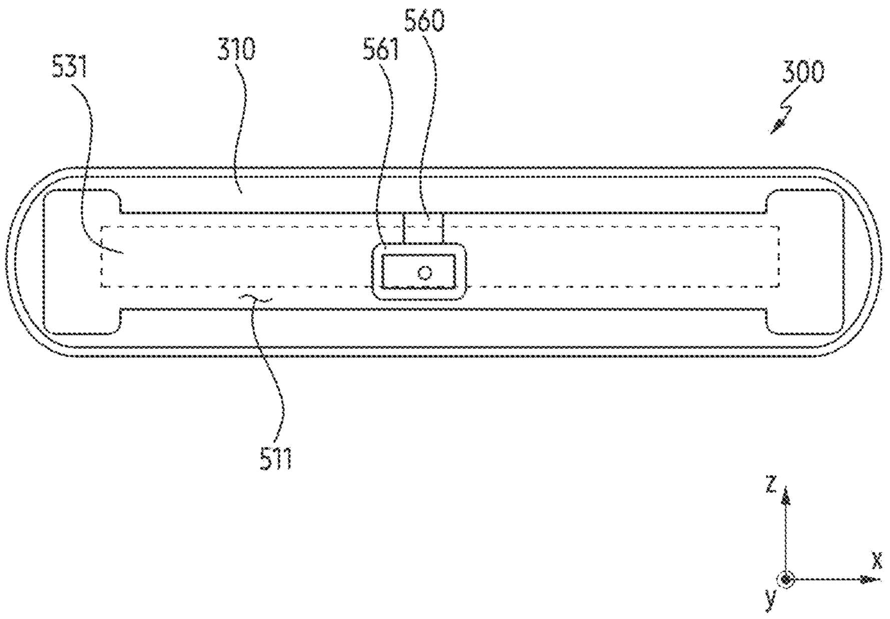
FIG. 5D is a diagram illustrating an electronic device viewed in a C direction of FIG. 5A, according to various embodiments.

FIG. 5C is a diagram illustrating a side member of a first housing according to various embodiments. FIG. 5D is a diagram illustrating the electronic device of FIG. 5A, as viewed in a direction C according to various embodiments.

Referring to FIG. 5C, the side member 530 may include a conductive portion 531 and a non-conductive portion 532.

According to an embodiment, the conductive portion 531 may be formed on a surface of the side member 530 facing the opening 511. The conductive portion 531 may be power-fed through the elastic member 570. An electrical path may be formed by a current flowing through the conductive portion 531, and the conductive portion 531 may emit electromagnetic waves to the outside of the electronic device. The conductive portion 531 operatively connected to the wireless communication circuit may perform wireless communication with an external electronic device in a specified band.

According to an embodiment, the non-conductive portion 532 may surround the conductive portion 531. For example, the non-conductive portion 532 may surround the periphery of the conductive portion 531. As another example, the non-conductive portion 532 may be a plate forming a side surface. The conductive portion 531 may be disposed on one surface of the non-conductive portion 532 facing the opening 511. According to an embodiment, one surface of the conductive portion 531 may face the opening 511. For example, one surface of the conductive portion 531 facing the first direction (+y direction) may be formed to face the opening 511. The other surface of the conductive portion 531 opposite to the one surface may be in contact with the non-conductive portion 532. For example, the other surface of the conductive portion 531 facing the second direction (−y direction) may be in contact with the non-conductive portion 532. The wavelength of electromagnetic waves radiated through the conductive portion 531 operating as an antenna may be determined depending on a length of the conductive portion 531. The resonance frequency of the antenna using the conductive portion 531 may be determined based on the length of the conductive portion 531. For example, as the length of the conductive portion 531 becomes shorter, the resonance frequency of the antenna using the conductive portion 531 may become higher, while as the length of the conductive portion 531 becomes longer, the resonance frequency of the antenna using the conductive portion 531 may become lower. The conductive portion 531 may be a pattern formed in the non-conductive portion 532, and the conductive portion 531 may operate as a multi-band antenna or a multiple antenna, depending on a shape of the conductive portion 531.

The side member 530 may be a conductive plate forming a side surface of the second housing 320 facing the second direction (−y direction). For example, the side member 530 may be a plate including only the conductive portion 531.

Referring to FIG. 5D, the electronic device 300 may include a first housing 310 and/or a second flexible printed circuit board 560. The first housing 310 may include an opening 511 formed on a side surface facing the second direction (−y direction). The opening 511 may be connected to an inner space of the first housing 310. The second area 330*b* and the guide rail 332 of the display 330 disposed in the inner space of the first housing 310 may be exposed in the second direction (−y direction) through the opening 511. The second flexible printed circuit board 560 may extend between the opening 511 and the second area 330*b* and may be exposed in the second direction (−y direction) through the opening 511.

According to an embodiment, when the first housing 310 is viewed in the first direction (+y direction), the conductive portion 531 may overlap the opening 511 and the second flexible printed circuit board 560 exposed through the opening 511. The second flexible printed circuit board 560 may further include a connection board 561 overlapping the conductive portion 531. The connection substrate 561 may further include an elastic member (e.g., the elastic member 570 of FIG. 5B) to be electrically connected to the conductive portion 531.

According to an embodiment, the electronic device 300 may form an opening in a side surface of the first housing 310 facing the second direction (−y direction) to provide an inner space for arranging the elastic member 570 such as a contact. The conductive portion 531 of the side member 530 power-fed via the elastic member 570 disposed in the opening 511 may be utilized as an antenna radiator. Implementing the antenna in the housing of the electronic device 300 may improve spatial efficiency of the electronic device. This improvement in space efficiency may allow for various different arrangements of electronic components in the inner space of the electronic device 300 or further increases the design freedom.

Figure 6A:
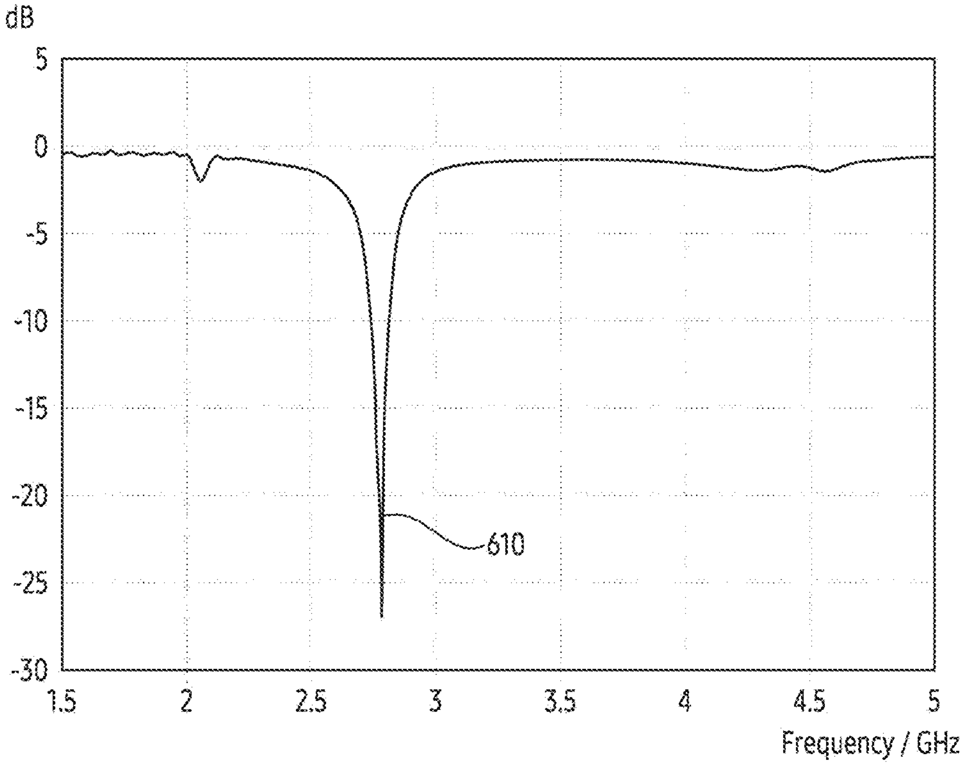
FIGS. 6A and 6B are graphs showing a resonance frequency and efficiency of an antenna using a side member of FIG. 5A according to various embodiments.
Figure 6B:
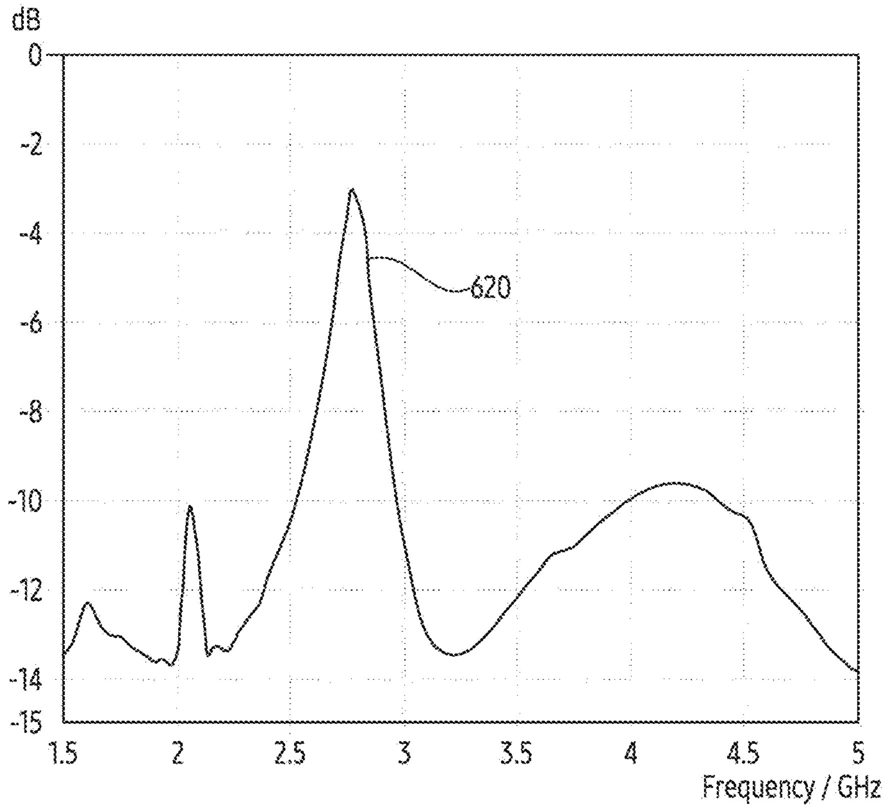

FIGS. 6A and 6B are graphs showing the resonance frequency and efficiency of the antenna using the side member of FIG. 5A according to various embodiments.

Referring to FIG. 6A, a graph 610 shows an amount of signals reflected to the conductive portion 531 compared to signals transmitted through the conductive portion 531, when the conductive portion (e.g., the conductive portion 531 of FIG. 5C) operates as an antenna. For example, the graph 610 shows a reflection loss in the conductive portion 531.

Looking at the graph 610, it can be seen that at approximately 2.7 GHz, the reflected amount is rapidly reduced compared to other frequencies. The conductive portion 531 may have a resonance frequency at approximately 2.7 GHz.

Referring to FIG. 6B, a graph 620 shows a frequency response curve in case where the conductive portion 531 operates as an antenna. It can be seen that graph 620 has a magnitude of approximately −3 dB at a resonance frequency of approximately 2.7 GHz. Further, it can be seen that the conductive portion 531, at its resonance frequency of approximately 2.7 GHz, has about half the magnitude of output power relative to the magnitude of input power. The conductive portion 531 may operate as an antenna in a peripheral frequency band including the resonance frequency having a higher efficiency than other frequency bands.

According to an embodiment, the electronic device 300 may have the conductive portion 531 disposed on the side surface of the first housing 310 facing the second direction. The conductive portion 531 of the electronic device 300 may operate as an antenna, reducing the influence of other conductive materials in the radiating area.

Figure 7A:
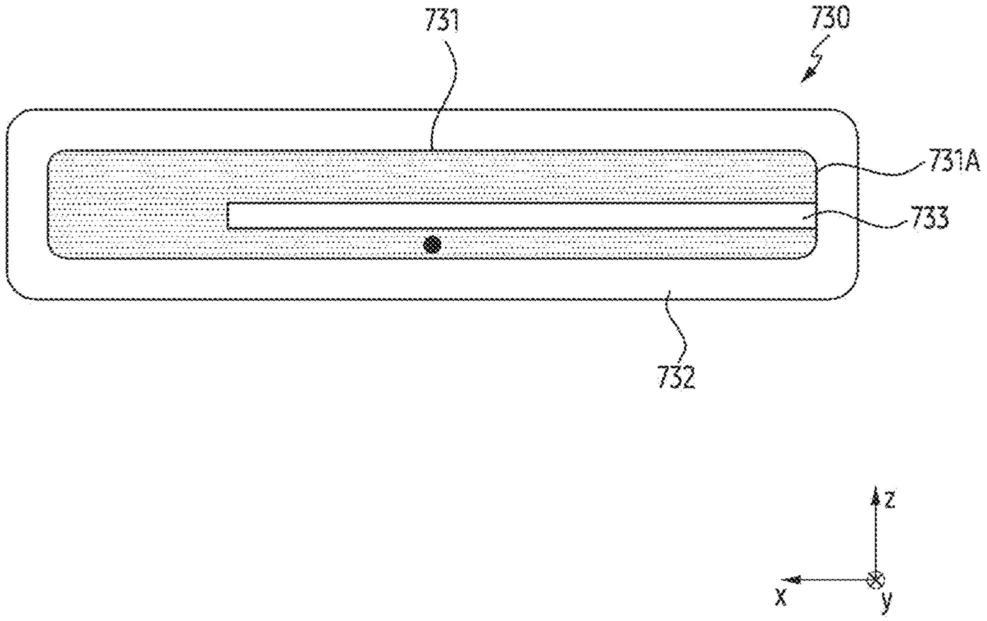
FIG. 7A is a diagram illustrating a side member including a conductive portion having a slit according to various embodiments.
Figure 7B:
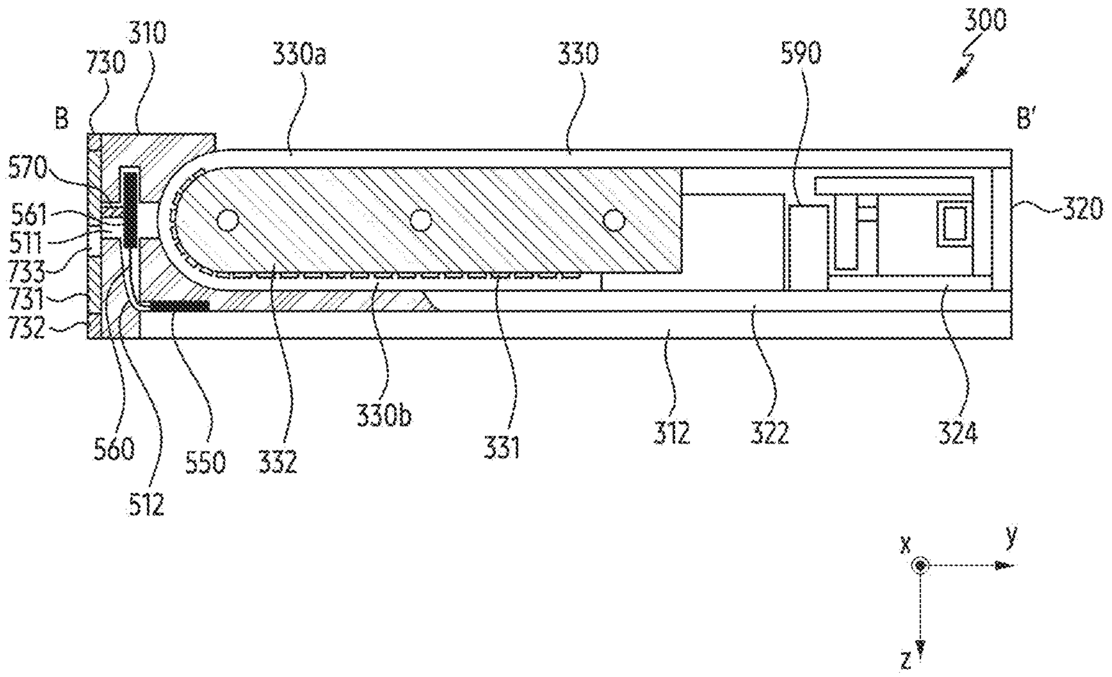
FIG. 7B is a cross-sectional view of an electronic device including a side member of FIG. 7A according to various embodiments.

FIG. 7A is a diagram illustrating a side member including a conductive portion having a slit according to various embodiments. FIG. 7B is a cross-sectional view of an electronic device including the side member of FIG. 7A according to various embodiments.

Referring to FIGS. 7A and 7B, a side member 730 (e.g., the side member 530 of FIG. 5C) may include a conductive portion 731 and a non-conductive portion 732.

According to an embodiment, the conductive portion 731 may be formed on a surface of the side member 730 facing the opening 511 (e.g., in the first direction, e.g., +y direction). The conductive portion 731 may be fed with power via the elastic member 570. An electrical path may be formed by a current flowing through the conductive portion 731, and the conductive portion 731 may emit electromagnetic waves to the outside of the electronic device. The conductive portion 731 operatively connected to the wireless communication circuit may perform wireless communication with an external electronic device in a specified band.

According to an embodiment, the conductive portion 731 may have a slit 733 extending in the x direction from a shorter edge 731A of edges of the conductive portion 731. The conductive portion 731 having the slit 733 may operate as a slit antenna.

According to an embodiment, the non-conductive portion 732 may surround the conductive portion 731. For example, the non-conductive portion 732 may surround the conductive portion 731 along its edges. The non-conductive portion 732 may surround the edges of the conductive portion 731 and may fill up with the slit 733. As another example, the non-conductive portion 732 may be a plate forming a side surface. The conductive portion 731 may be disposed on one surface of the non-conductive portion 732 facing the opening 511.

The side member 730 may be a conductive plate having the slit 733 forming the side surface of the second housing 320 facing the second direction (−y direction). For example, the side member 730 may include the conductive portion 731 formed of a conductive plate and the non-conductive portion disposed in the slit 733 formed in the conductive portion 731.

Referring to FIG. 7B, the electronic device 700 may include a first housing 310, a second housing 320, a display 330, a first printed circuit board 324, a second printed circuit board 550, and/or a side member 730. The electronic device 700 of FIG. 7B may be substantially the same as or similar to the electronic device 300 of FIG. 5B except for the side member 730. A redundant description of the first housing 310, the second housing 320, the display 330, the first printed circuit board 324, and the second printed circuit board 550, which are substantially the same as or similar to FIG. 5B, will not be iterated.

According to an embodiment, between the side surface facing the second direction (−y direction) of the side surfaces of the first housing 310 and the second housing 320, and the deformable portion 330*b* of the display 330 may be a space for disposing a contact or a C-clip for electrical connection between the antenna radiator and the feeding line. Since there is no conductive material overlapping the side surface facing the second direction (−y direction) of the first housing 310, the side surface facing the second direction (−y direction) of the first housing 310 may be utilized as an antenna radiator. The conductive portion 731 of the side member 730 may be electrically connected to the first printed circuit board 324 in the second housing 320 on which the wireless communication circuit is disposed, through the elastic member 570, the second printed circuit board 550, and the first flexible printed circuit board 590. The side member 530 may receive a signal to be transmitted to the external electronic device from the first printed circuit board 324 on which the wireless communication circuit is disposed.

According to an embodiment, the side member 730 may form a side surface of the first housing 310 facing the second direction (−y direction). The side member 730 may be coupled to the first housing 310. The side member 730 may include a conductive material that operates as an antenna radiator. The side member 730 may include the conductive portion 731 and the non-conductive portion 732. The non-conductive portion 732 may surround the conductive portion. The conductive portion 731 may include the slit 733. The slit 733 may be filled with a non-conductive material. For example, the slit 733 may be integrally formed with the non-conductive portion 732.

According to an embodiment, the conductive portion 731 of the side member 730 may form the same plate as the non-conductive portion 732. For example, the conductive portion 731 of the side member 730 may occupy an area in which the non-conductive portion 732 except for the slit 733 is disposed. As another example, the conductive portion 731 and the non-conductive portion 732 of the side member 730 may form different plates. For example, a distance between the conductive portion 731 and the opening 511 may be shorter than the distance between the non-conductive portion 732 and the opening 511. The conductive portion 731 may be formed on a surface of the non-conductive portion 732 facing the opening 511. For example, the conductive portion 731 may be patterned on the surface of the non-conductive portion 732 facing the opening 511.

The second flexible printed circuit board 560 may be disposed between the second area 330*b* and the conductive portion of the side member 530. The second flexible printed circuit board 560 may extend from the second printed circuit board 550 and may be exposed toward the side member 530 through the opening 511 formed between the second area 330*b* and the side member 530. The second flexible printed circuit board 560 may further include a connection board 561 exposed through the opening 511. The elastic member 570 may be disposed on the connection substrate 561 disposed at the other end of the second flexible printed circuit board 560. The elastic member 570 may protrude toward the opening 511. The elastic member 570 may be connected to the conductive portion 731 of the side member 730, when the side member 530 is fastened to the first housing 310. The elastic member 570 may be electrically connected to a feeding point positioned at the conductive portion 731 of the side member 530.

The conductive portion 731 fed with power through the elastic member 570 may operate as a multi-band antenna. A signal in a first frequency band may be communicated with an external electronic device via an electrical path formed by a current flowing through a surface of the conductive portion 731, and a signal in a second frequency band may be communicated with an external electronic device via the slit 733 formed in the conductive portion 731. The first frequency band may be determined based on the electrical path of the current flowing through the surface of the conductive portion 731. The second frequency band may be determined based on the length of the slit 733 formed in the conductive portion 731.

As described above, the electronic device 700 according to an embodiment includes a configuration for movement of the housing, and thus it may be difficult to implement a side surface of a housing parallel to the movement direction of the housing as an antenna or to secure a space for disposing an antenna module. The electronic device 300 may reduce the influence by other conductive materials, by utilizing the side surface of the housing facing the second direction as an antenna radiator. Implementing the antenna in the housing of the electronic device 700 may allow for improved spatial efficiency of the electronic device. The above improvements in space efficiency may allow for various different arrangements of electronic components in the inner space inside the electronic device 700 or increase design freedom.

According to an embodiment, the side member 730 of the electronic device 700 may have the conductive portion 731 having the slit 733 to provide a multi-band antenna.

Figure 8:
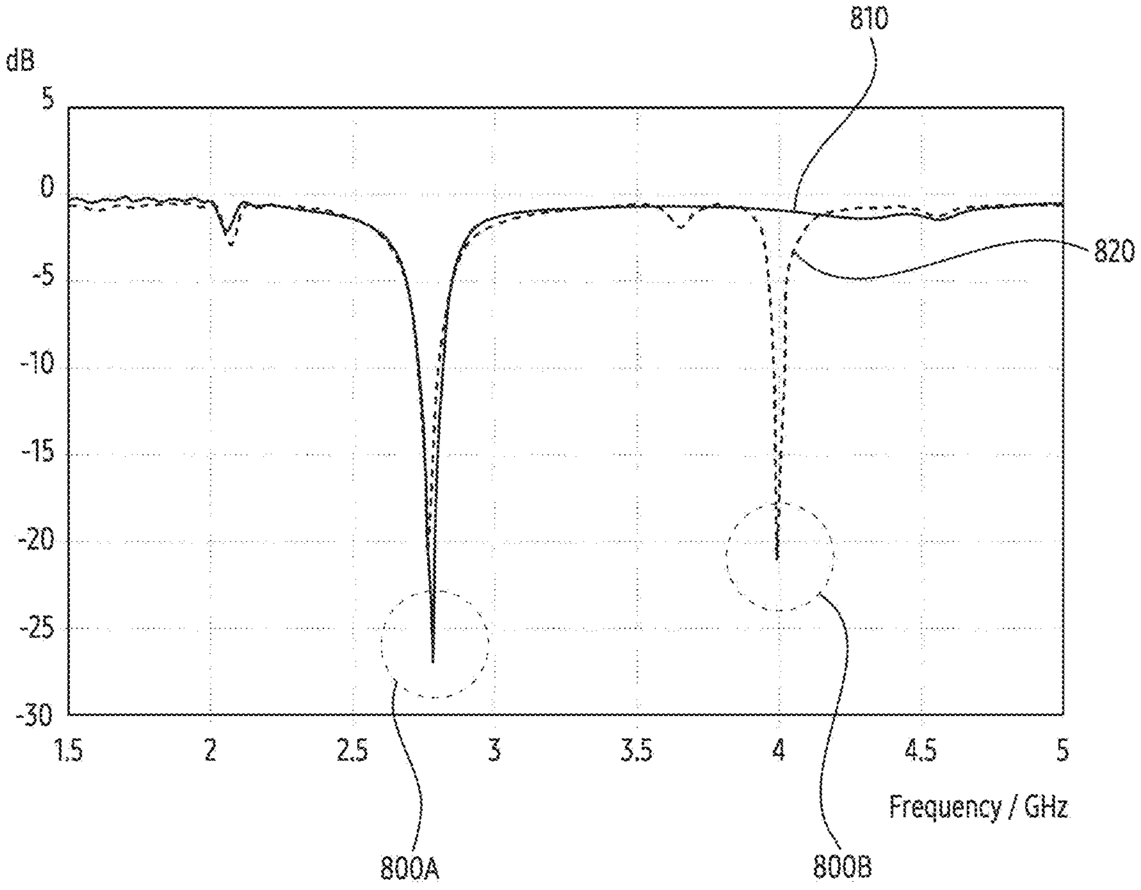
FIG. 8 is a graph illustrating a resonance frequency of an antenna using a side member of FIG. 5B and an antenna using a side member of FIG. 7A according to various embodiments.

FIG. 8 is a graph showing resonance frequencies of an antenna using the side member of FIG. 5B and an antenna using the side member of FIG. 7A according to various embodiments.

Referring to FIG. 8, a graph 810 shows a reflection loss in the conductive portion 531 included in the side member 530 of FIG. 5B operating as an antenna. A graph 820 shows a reflection loss in the conductive portion 731 included in the side member 730 of FIG. 7A operating as an antenna.

Looking at the graph 810, it can be seen that at approximately 2.7 GHz, the amount of reflection is rapidly reduced compared to that in other frequencies. The conductive portion 531 may have the resonance frequency at approximately 2.7 GHz.

Referring to the graph 820, it can be seen that at approximately 2.7 GHz, the amount of reflection decreases sharply compared to that in other frequencies, and further, at approximately 4 GHz, the amount of reflection decreases sharply compared to that in other frequencies. The conductive portion 731 may have the resonance frequency at approximately 2.7 GHz and approximately 4 GHz.

According to an embodiment, in the conductive portion 731, an electrical length of the current flowing through the surface of the conductive portion 731 may be similar to that of the current flowing through the surface of the conductive portion 531 of FIG. 5B. A radiation volume through the conductive portion 731 may be similar to the radiation volume through the conductive portion 531. The conductive portion 731 and the conductive portion 531 having a similar radiation volume or electrical length may have a first resonance frequency in a first frequency (e.g., approximately 2.7 GHz) area 800A.

According to an embodiment, the conductive portion 731 may include the slit 733. Owing to the slit 733 formed in the conductive portion 731, the conductive portion 731 may have a second resonance frequency in a second frequency (e.g., approximately 4 GHz) area 800B.

According to an embodiment, the first resonance frequency of the conductive portion 731 may be determined based on the radiation volume or electrical length of the conductive portion 731. The second resonance frequency of the conductive portion 731 may be determined based on the length of the slit 733 of the conductive portion 731. The electronic device 700 may provide a multi-band antenna capable of communicating signals of the first frequency band and the second frequency band with an external electronic device, through the conductive portion 731 including the slit 733.

Figure 9A:
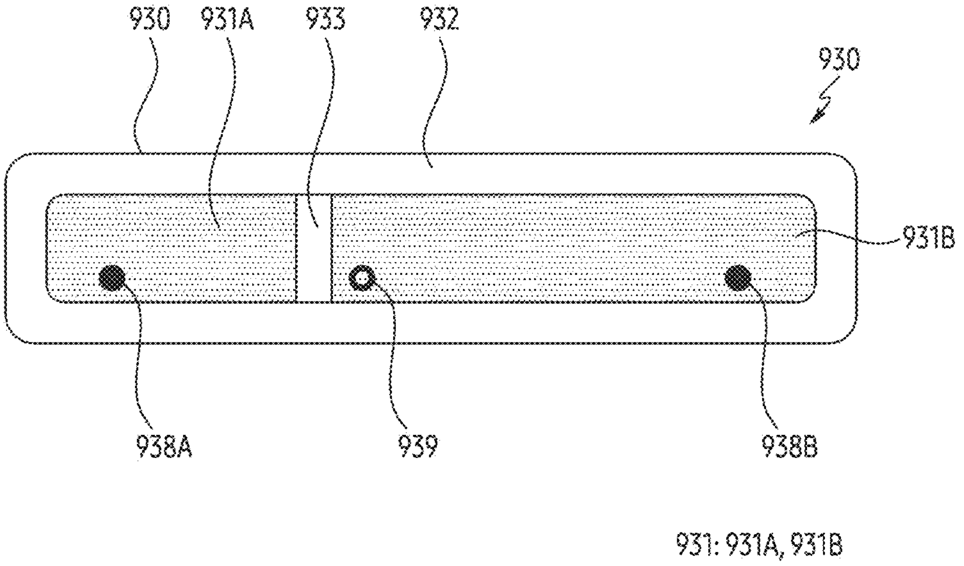
FIG. 9A is a diagram illustrating a side member including a conductive portion having a segmented portion according to various embodiments.
Figure 9B:
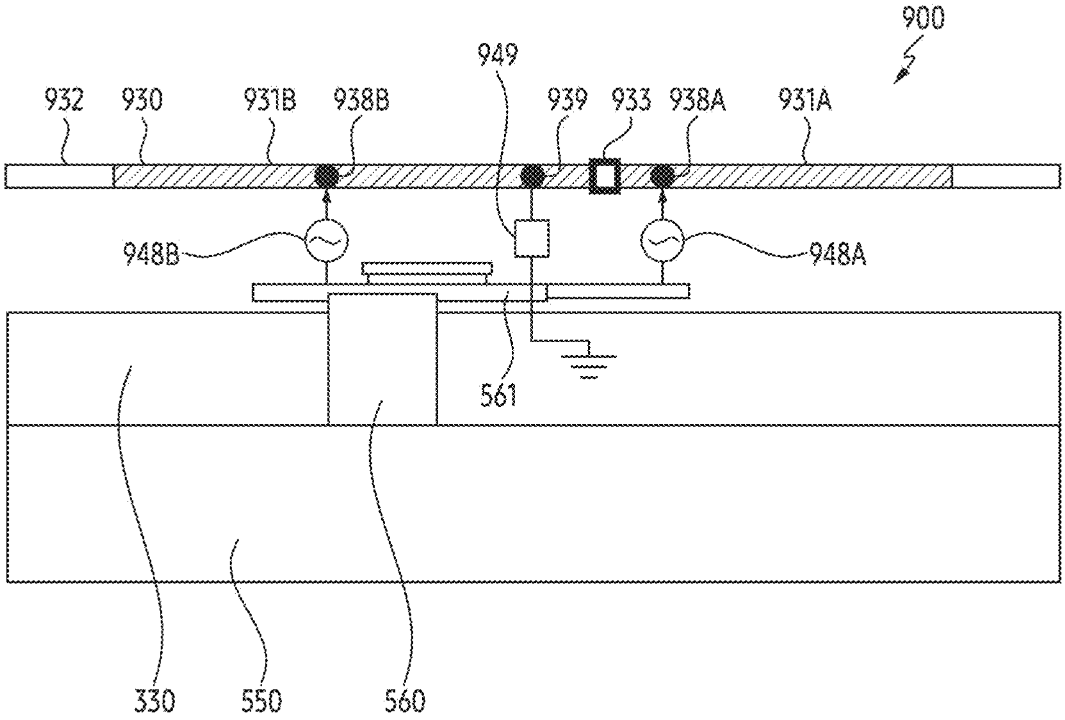
FIG. 9B is a diagram illustrating a rear view of an electronic device including a side member of FIG. 9A according to various embodiments.

FIG. 9A is a diagram illustrating a side member including a conductive portion having a segmented portion according to various embodiments. FIG. 9B is a diagram illustrating a rear view of an electronic device including the side member of FIG. 9A according to various embodiments.

Referring to FIGS. 9A and 9B, a side member 930 (e.g., the side member 530 of FIG. 5C) may include a segmented conductive portion 931, a non-conductive portion 932, and a segmented portion 933.

According to an embodiment, the segmented conductive portion 931 may be formed on one surface of the side member 930. The segmented conductive portion 931 may be formed to face the side member 930 facing an inside of the electronic device 900. The segmented conductive portion 931 may be fed with power through elastic members. The segmented conductive portion 931 may be divided into a first conductive portion 931A and a second conductive portion 931B by the segmented portion 933. The first conductive portion 931A may be spaced apart from the second conductive portion 931B. The segmented portion 933 may be disposed between the first conductive portion 931A and the second conductive portion 931B. The segmented portion 933 may be filled with a non-conductive material. The segmented conductive portion 931 operatively connected to the wireless communication circuit may perform wireless communication with an external electronic device in a specified band. The first conductive portion 931A may be fed with power through a first feeding point 938A, and the second conductive portion 931B may be fed with power through a second feeding point 938B. According to an embodiment, the segmented conductive portion 931 may operate as a plurality of antenna radiators using each of the first conductive portion 931A and the second conductive portion 931B. An electrical path of the first conductive portion 931A may be formed by a current applied through the first feeding point 938A, and the first conductive portion 931A may emit electromagnetic waves in the first frequency band to the outside of the electronic device. An electrical path of the second conductive portion 931B may be formed by a current applied through the second feeding point 938B, and the second conductive portion 931B may emit electromagnetic waves in the second frequency band to the outside of the electronic device. The second conductive portion 931B may further include a ground point 939. Although the ground point 939 is illustrated as being disposed only in the second conductive portion 931B, the first conductive portion 931A may also include a ground point when the first conductive portion 931A has an insufficient ground area. For example, the ground point 939 may be disposed on the first conductive portion 931A and/or the second conductive portion 931B. The ground point 939 may be disposed on either one of the first conductive portion 931A and the second conductive portion 931B, or each of a plurality of point points may be disposed on the first conductive portion 931A and the second conductive portion 931B.

According to an embodiment, the non-conductive portion 932 may surround the segmented conductive portion 931. For example, the non-conductive portion 932 may surround the segmented conductive portion 931 along its edges. The non-conductive portion 932 may surround the edges of the first conductive portion 931A and the second conductive portion 931B. The segmented portion 933 may be filled with the non-conductive portion 932. As another example, the non-conductive portion 932 may be a plate forming its side surface. The segmented conductive portion 931 may be disposed on one surface of the non-conductive portion 932 facing the connection substrate 561.

The side member 930 may be a conductive plate having the segmented portion 933 forming a side surface of the second housing 320 (e.g., the second housing 320 of FIG. 3A) facing the second direction (−y direction). For example, the side member 930 may include the segmented conductive portion 931 formed of a conductive plate and the non-conductive portion disposed in the segmented portion 933 formed between the first conductive portion 931A and the second conductive portion 931B.

Referring to FIG. 9B, the electronic device 900 may include a display 330, a second printed circuit board 550, and/or a side member 930. The electronic device 700 of FIG. 7B may be substantially the same as or similar to the electronic device 300 of FIG. 5B except for the side member 930. Although not illustrated in FIG. 9B, the electronic device 900 may further include the first housing 310, the second housing 320, and the first printed circuit board 324, which are the same as or similar to those of FIG. 5B, and a redundant description related thereto will be not iterated.

The segmented conductive portion 931 of the side member 930 may be electrically connected to the first printed circuit board 324 (e.g., the first printed circuit board 324 of FIG. 5B) in the second housing 320 (e.g., the second housing 320 of FIG. 5B) on which the wireless communication circuit is disposed, through the elastic member 570, the second printed circuit board 550, and the first flexible printed circuit board 590 (e.g., the first flexible printed circuit board 590 of FIG. 5B). The side member 930 may receive a signal to be transmitted to an external electronic device from the first printed circuit board 324 on which the wireless communication circuit is disposed.

According to an embodiment, the side member 930 may form a side surface facing the second direction (−y direction) of the electronic device 900. The side member 930 may include a conductive material that operates as an antenna radiator. The side member 930 may include the first conductive portion 931A, the second conductive portion 931B, and the non-conductive portion 932. The non-conductive portion 932 may form the segmented portion 933 configured to surround the conductive portion and split the first conductive portion 931A and the second conductive portion 931B. For example, the segmented portion 933 may be integrally formed with the non-conductive portion 932.

According to an embodiment, the first conductive portion 931A and the second conductive portion 931B of the side member 930 may form the same plate as the non-conductive portion 932. For example, the conductive portion 731 of the side member 730 may occupy an area in which the non-conductive portion 732 except for the slit 733 is disposed. As another example, the segmented conductive portion 931 and the non-conductive portion 732 of the side member 930 may form different plates. The segmented conductive portion 931 may be patterned on the surface of the non-conductive portion 932.

The second flexible printed circuit board 560 may extend along the second area 330*b* of the display 333 and may be disposed between the second area 330*b* and the segmented conductive portion 931 of the side member 930. The second flexible printed circuit board 560 may further include a connection board 561 facing the conductive portion 931. The elastic members may be disposed on the connection substrate 561. The elastic members may protrude toward the opening 511 (e.g., the opening 511 of FIG. 5B) formed in the first housing 310. The elastic members may be connected to the first conductive portion 931A and the second conductive portion 931B of the side member 930, when the side member 930 is fastened to the first housing 310. The elastic members connected to a first feeding portion 948A, a second feeding part 948B, and a ground portion 949 may be electrically connected to the first feeding point 938A, the second feeding point 938B, or the ground point 939 located in the segmented conductive portion 931 of the side member 530. For example, the elastic member connected to the first feeding portion 948A may be connected to the first feeding point 938A of the first conductive portion 931A. The elastic member connected to the second feeding portion 948B may be connected to the second feeding point 938B of the second conductive portion 931B. The connection member connected to the ground portion 949 may be connected to the ground point 939 of the second conductive portion 931B.

The segmented conductive portion 931 fed with power through the elastic members may operate as a multi-antenna. A signal in a first frequency band may be communicated with an external electronic device via an electrical path formed by a current flowing through a surface of the first conductive portion 931A, and a signal in a second frequency band may be communicated with an external electronic device via an electrical path formed by a current flowing through a surface of the second conductive portion 931B. The first frequency band may be determined based on the electrical path of the current flowing through the surface of the first conductive portion 931A. The second frequency band may be determined based on the electrical path of the current flowing through the surface of the second conductive portion 931B.

The electronic device 900 according to an embodiment can reduce the influence by other conductive materials, utilizing the side surface of the housing facing the second direction as an antenna radiator. Implementing the antenna in the housing of the electronic device 900 may allow for improved spatial efficiency of the electronic device.

According to an embodiment, the side member 930 of the electronic device 900 may have the segmented conductive portion 931, thereby providing a multi-antenna that utilizes each of the first conductive portion 931A and the second conductive portion 931B as an antenna radiator.

Figure 10:
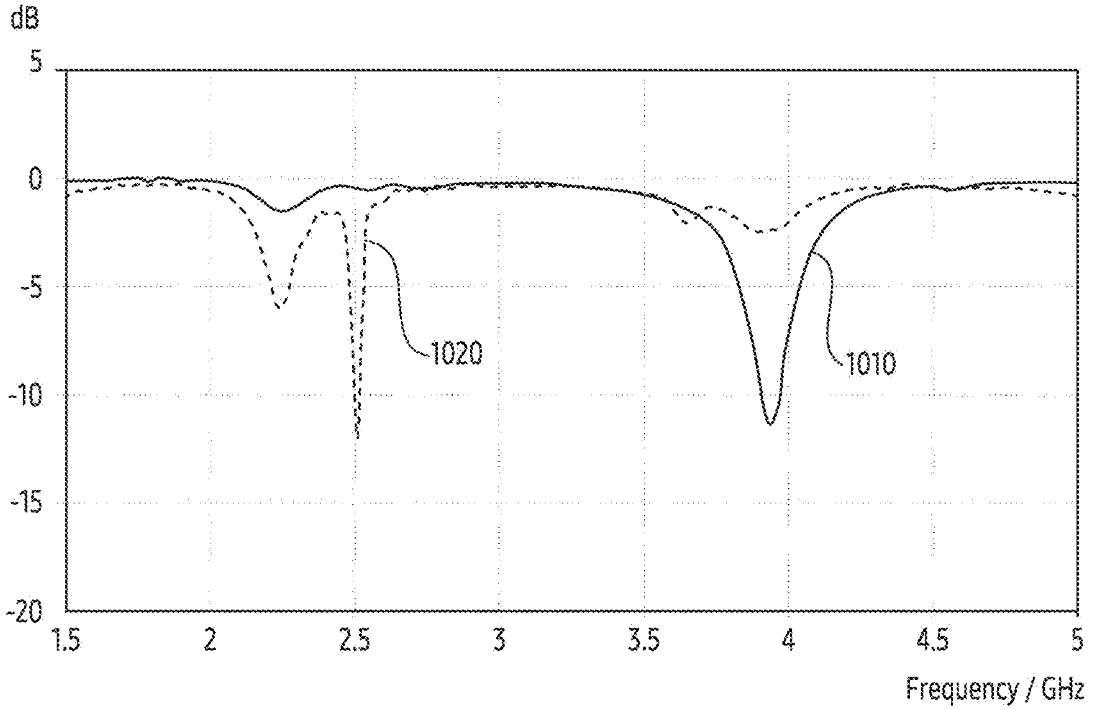
FIG. 10 is a graph illustrating resonance frequencies of a plurality of antennas using a side member of FIG. 9A according to various embodiments.

FIG. 10 is a graph showing resonance frequencies of a plurality of antennas using the side member of FIG. 9A according to various embodiments.

Referring to FIG. 10, a graph 1010 shows a reflection loss in a first conductive portion 931A operating as a first antenna. A graph 1020 shows a reflection loss in a second conductive portion 931B operating as the second antenna.

Looking at the graph 1010, it can be seen that at approximately 3.8 GHz, the amount reflected is rapidly reduced compared to that in other frequencies. The first conductive portion 931A may have a first resonance frequency at approximately 3.8 GHz.

Looking at the graph 1020, it can be seen that at approximately 2.5 GHz, the amount reflected is rapidly reduced compared to those in other frequencies. The second conductive portion 931B may have a second resonance frequency at approximately 2.5 GHz.

According to an embodiment, the resonance frequency of the first conductive portion 931A, wherein the electrical path thereof is shorter than the electrical path of the second conductive portion 931B, may be higher than the resonance frequency of the second conductive portion 931B.

According to an embodiment, the electrical lengths of the first conductive portion 931A and the second conductive portion 931B may be adjusted by adjusting the position of the segmented portion (e.g., the segmented portion 933 of FIG. 9A) between the first conductive portion 931A and the second conductive portion 931B. The first resonance frequency band and the second resonance frequency band may be set by the adjusted electrical lengths.

The side member 930 having the segmented conductive portion 931 may provide multiple antennas including a first antenna operable in a first frequency band and a second antenna operable in a second frequency band.

According to an example embodiment, an electronic device (e.g., the electronic device 300 of FIG. 5B) may include: an inner housing (e.g., the second housing 320 of FIG. 5B); an outer housing (e.g., the first housing 310 of FIG. 5B) coupled to the inner housing and configured to enable the inner housing to move in a first direction or a second direction opposite to the first direction, the outer housing including an opening (e.g., the opening 511 of FIG. 5B) formed in a portion of a surface facing the second direction configured to expose an inner space of the electronic device; a side surface member (e.g., the side member 530 of FIG. 5B) comprising a conductive material including at least one conductive portion (e.g., the conductive portion 531 of FIG. 5C) forming at least a portion of a side surface of the outer housing facing the second direction and configured to close the opening; and a wireless communication circuit operably coupled to the at least one conductive portion. According to an example embodiment, the wireless communication circuit may be configured to communicate with an external electronic device in a specified frequency band through the at least one conductive portion.

According to an example embodiment, the electronic device may further include: a first printed circuit board (e.g., the first printed circuit board 324 of FIG. 5B) in the inner housing, on which the wireless communication circuit is disposed, a second printed circuit board (e.g., the second printed circuit board 550 of FIG. 5B) electrically connected to the first printed circuit board and disposed at a periphery close to the side member among peripheries of the outer housing, and a flexible printed circuit board (e.g., the second flexible printed circuit board 560 of FIG. 5B) extending from the second printed circuit board toward the opening. According to an example embodiment, the flexible printed circuit board may be electrically connected to the at least one conductive portion.

According to an example embodiment, the outer housing may include a slot (e.g., the slot 512 of FIG. 5B) formed at the periphery of the outer housing, wherein the slot may comprise a passage through which the flexible printed circuit board is configured to pass.

According to an example embodiment, the electronic device may further include a display (e.g., the display 330 of FIG. 5B) disposed on the inner housing and configured to be expanded and/or reduced as the inner housing moves.

According to an example embodiment, the display may include a planar portion (e.g., the first area 330*a* of FIG. 5B) disposed on the inner housing and a deformable portion (e.g., the second area 330*b* of FIG. 5B) extending from the planar portion.

According to an example embodiment, the flexible printed circuit board may be disposed between the deformable portion and the side member.

According to an example embodiment, the flexible printed circuit board may be electrically connected to a feeding point positioned at the at least one conductive portion.

According to an example embodiment, the side member may include a conductive plate forming the side surface.

According to an example embodiment, the side member may include a non-conductive portion (e.g., the non-conductive portion 532 of FIG. 5C) surrounding the at least one conductive portion.

According to an example embodiment, one surface of the at least one conductive portion may be configured to face the inner space.

According to an example embodiment, the other surface of the at least one conductive portion may be disposed on the non-conductive portion.

According to an example embodiment, the at least one conductive portion may include a slit (e.g., the slit 733 of FIG. 7A) extending from a shorter periphery among peripheries of the at least one conductive portion and parallel to a longer periphery among the peripheries of the at least one conductive portion.

According to an example embodiment, the at least one conductive portion may have a plurality of resonance frequencies.

According to an example embodiment, the side member may surround the at least one conductive portion. According to an example embodiment, the side member may further include a non-conductive portion (e.g., the non-conductive portion 732 of FIG. 7A) filling the slit.

According to an example embodiment, the at least one conductive portion may include a first conductive portion (e.g., the first conductive portion 931A of FIG. 9A) and a second conductive portion (e.g., the second conductive portion 931B of FIG. 9A) spaced apart from the first conductive portion along a longer periphery of the at least one conductive portion. The side member may further include a non-conductive portion (e.g., the non-conductive portion 932 of FIG. 9A) formed perpendicular to the longer periphery and disposed between the first conductive portion and the second conductive portion.

The first conductive portion may include a first feeding point and a ground point, and the second conductive portion may include a second feeding point.

According to an example embodiment, the first conductive portion may have a first resonance frequency. According to an example embodiment, the second conductive portion may have a second resonance frequency.

According to an example embodiment, the electronic device may further include an elastic member (e.g., the elastic member 570 of FIG. 5B) comprising an elastic material contacting a feeding point of the conductive portion, electrically connected to the wireless communication circuit, and including a conductive material.

According to an example embodiment, an electronic device (e.g., the electronic device 300 of FIG. 5B) may include: an inner housing (e.g., the second housing 320 of FIG. 5B); an outer housing (e.g., the first housing 310 of FIG. 5B) coupled to the inner housing and configured to move the inner housing in a first direction or a second direction opposite to the first direction, and including an opening (e.g., the opening 511 of FIG. 5B) formed on a portion of a surface facing the second direction configured to connect a space formed by coupling to the inner housing; and a display (e.g., the display 330 of FIG. 5B) including a planar portion disposed on the inner housing and visible to the outside and a deformable portion extending from the planar portion in the second direction, the deformable portion configured to be expanded as the inner housing moves in the first direction or to be reduced as the inner housing moves in the second direction. According to an example embodiment, the electronic device may further include a side member (e.g., the side member 530 of FIG. 5B) comprising a conductive material including at least one conductive portion forming a portion of a side surface of the outer housing that overlaps the opening and a portion of the deformable portion, when the outer housing is viewed in the second direction.

According to an example embodiment, the electronic device may further include a wireless communication circuit operatively connected to the at least one conductive portion.

According to an example embodiment, the electronic device may further include a flexible printed circuit board (e.g., the flexible printed circuit board 560 of FIG. 5B) electrically connecting the wireless communication circuit and the at least one conductive portion.

According to an example embodiment, the wireless communication circuit may be configured to communicate with an external electronic device in a specified frequency band through the at least one conductive portion.

According to an example embodiment, the flexible printed circuit board may include an elastic member (e.g., the elastic member 570 of FIG. 5B) comprising an elastic material extending into a space between the opening and the deformable portion and connected to the at least one conductive portion.

According to an example embodiment, the outer housing may include a slot (e.g., the slot 512 of FIG. 5B) formed at the periphery of the outer housing.

According to an example embodiment, the flexible printed circuit board may be configured to pass through the slit.

According to an example embodiment, the flexible printed circuit board may be electrically connected to a feeding point of the at least one conductive portion.

According to an example embodiment, the side member may include a non-conductive portion (e.g., the non-conductive portion 532 of FIG. 5C) surrounding the at least one conductive portion.

According to an example embodiment, one surface of the at least one conductive portion may face the opening.

According to an example embodiment, another surface of the at least one conductive portion may be in contact with the non-conductive portion.

According to an example embodiment, the at least one conductive portion may include a slit (e.g., the slot 732 of FIG. 7A) extending from one of peripheries of the at least one conductive portion and parallel to a boundary between the planar portion and the deformable portion.

According to an example embodiment, the at least one conductive portion may include a first conductive portion (e.g., the first conductive portion 931A of FIG. 9A) and a second conductive portion (e.g., the second conductive portion 931B of FIG. 9A) spaced apart from the first conductive portion.

According to an example embodiment, the side member may further include a non-conductive portion (e.g., the non-conductive portion 932 of FIG. 9A) formed perpendicular to the boundary between the planar portion and the deformable portion and disposed between the first conductive portion and the second conductive portion.

According to an example embodiment, the first conductive portion may include a first feeding point (e.g., the first feeding point 938A of FIG. 9A), and the second conductive portion may include a second feeding point (e.g., the second feeding point 938B of FIG. 9A) and a ground point (e.g., the ground point 939 of FIG. 9A).

According to an example embodiment, the first conductive portion may include a first feeding point (e.g., the first feeding point 938A of FIG. 9A) and a ground point, and the second conductive portion may include a second feeding point (e.g., the second feeding point 938B of FIG. 9A).

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment, the electronic devices are not limited to those described above.

It should be appreciated that various embodiments and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

No claim element is to be construed under the provisions of 35 U.S.C. § 112, sixth paragraph, unless the element is expressly recited using the phrase "means for" or "means.

What is claimed is:

1. An electronic device comprising:

an inner housing;

an outer housing coupled to the inner housing and configured to enable the inner housing to move in a first direction or a second direction opposite to the first direction, the outer housing including an opening connected to a space formed by the inner housing and the outer housing, and the opening formed at a portion of the outer housing facing the second direction;

a side surface member coupled to the portion of the outer housing and having a side surface facing the second direction, the side surface member including at least one conductive portion;

a first printed circuit board (PCB) disposed in the inner housing;

a second PCB disposed in the outer housing and connected to the first PCB;

a flexible printed circuit board (FPCB) extending from the second PCB toward the side surface member through the opening and being connected to the at least one conductive portion; and a wireless communication circuit disposed on the first PCB and connected to the at least one conductive portion through the second PCB and the FPCB, wherein the wireless communication circuit is configured to communicate with an external electronic device in a specified frequency band through the at least one conductive portion.

2. The electronic device of claim 1, wherein the portion of the outer housing facing the second direction comprises a periphery of the outer housing facing the second direction.

3. The electronic device of claim 2, wherein the outer housing comprises a slot formed at the periphery of the outer housing, and wherein the FPCB is disposed to pass through the slot.

4. The electronic device of claim 1, comprising a display disposed on the inner housing and configured to expand based on the inner housing moving in the first direction, and to contract based on the inner housing moving in the second direction, wherein the display comprises a planar portion disposed on the inner housing and a deformable portion extending from the planar portion.

5. The electronic device of claim 4, wherein at least a part of the FPCB is disposed between the deformable portion and the at least one conductive portion.

6. The electronic device of claim 1, wherein the first PCB and the second PCB are connected through another FPCB, wherein the FPCB comprises a side facing the side surface member, and wherein the FPCB is electrically connected to a feeding point of the at least one conductive portion through a connection member disposed on the side.

7. The electronic device of claim 1, wherein the side surface member includes a non-conductive portion disposed in a slit formed by the at least one conductive portion.

8. The electronic device of claim 7, wherein the at least one conductive portion is configured to provide signals on a first resonance frequency and a second resonance frequency different from the first resonance frequency.

9. The electronic device of claim 7, wherein the side surface member includes a non-conductive portion filling the slit and surrounding the at least one conductive portion.

10. The electronic device of claim 1, wherein the side surface member includes a conductive plate forming the side surface.

11. The electronic device of claim 1, wherein the side surface member includes a non-conductive portion surrounding the at least on conductive portion.

12. The electronic device of claim 11, wherein a first side of the side surface member faces the opening of the outer housing, and wherein a second side opposite to the first side of the side surface member contacts the non-conductive portion.

13. The electronic device of claim 1, wherein the at least one conductive portion includes a first conductive portion and a second conductive portion spaced apart from the first conductive portion, and wherein the side surface member includes a non-conductive portion disposed between the first conductive portion and the second conductive portion.

14. The electronic device of claim 13, wherein the first conductive portion includes a first feeding point, and wherein the second conductive portion includes a second feeding point and a grounding point.

15. The electronic device of claim 13, wherein the wireless communication circuit is configured to:

communicate with an external electronic device in a first frequency band through the first conductive portion, and communicate with an external electronic device in a second frequency band through the second conductive portion.

16. The electronic device of claim 1, comprising an elastic member disposed on the FPCB, wherein the elastic member contacts the at least one conductive portion of the side surface member, and is electrically connected to the wireless communication circuit.

17. An electronic device comprising:

an inner housing;

an outer housing coupled to the inner housing and configured to enable the inner housing to move in a first direction or a second direction opposite to the first direction, the outer housing including an opening connected to a space formed by the inner housing and the outer housing, and the opening formed at a portion of the outer housing facing the second direction;

a display including a planar portion disposed on the inner housing and visible to an outside and a deformable portion extending from the planar portion, and the display is configured to expand as the inner housing moves in the first direction or contract as the inner housing moves in the second direction;

a side surface member coupled to the portion of the outer housing and including at least one conductive portion, the side surface member overlapping the opening and a portion of the deformable portion, when the outer housing is viewed in the second direction;

a first printed circuit board (PCB) disposed in the inner housing;

a second PCB disposed in the outer housing and connected to the first PCB;

a flexible printed circuit board (FPCB) extending from the second PCB through the opening and connected to the at least one conductive portion through the opening; and a wireless communication circuit disposed on the first PCB and connected to the at least one conductive portion through the second PCB and the FPCB, wherein the wireless communication circuit is configured to communicate with an external electronic device in a specified frequency band through at least one conductive portion.

18. The electronic device of claim 17, comprising:

an elastic member disposed on the FPCB, wherein the elastic member contacts the at least one conductive portion of the side surface member and is connected to the at least one conductive portion.

19. The electronic device of claim 17, wherein the opening formed at the portion of the outer housing comprises a slot formed at a periphery of the outer housing facing the side surface member, and wherein the FPCB is disposed to pass through the slot.

20. The electronic device of claim 17, wherein the FPCB is electrically coupled to a feeding point of the at least one conductive portion.

* * * * *